United States Patent
Crowley et al.

(10) Patent No.: US 7,383,476 B2
(45) Date of Patent: Jun. 3, 2008

(54) SYSTEM ARCHITECTURE AND METHOD FOR THREE-DIMENSIONAL MEMORY

(75) Inventors: Matthew P. Crowley, San Jose, CA (US); Luca G. Fasoli, San Jose, CA (US); Alper Ilkbahar, San Jose, CA (US); Mark G. Johnson, Los Altos, CA (US); Bendik Kleveland, Santa Clara, CA (US); Thomas H. Lee, Burlingame, CA (US); Roy E. Scheuerlein, Cupertino, CA (US)

(73) Assignee: SanDisk 3D LLC, Sunnyvale, CA (US)

( * ) Notice: Subject to any disclaimer, the term of this patent is extended or adjusted under 35 U.S.C. 154(b) by 341 days.

(21) Appl. No.: 10/774,758

(22) Filed: Feb. 9, 2004

(65) Prior Publication Data

US 2004/0250183 A1    Dec. 9, 2004

Related U.S. Application Data

(60) Provisional application No. 60/446,910, filed on Feb. 11, 2003.

(51) Int. Cl.
   *G11C 29/00*   (2006.01)
   *G11C 11/00*   (2006.01)
(52) U.S. Cl. ..................... 714/723; 365/130
(58) Field of Classification Search ............... None
   See application file for complete search history.

(56) References Cited

U.S. PATENT DOCUMENTS 4,959,771 A  *  9/1990  Ardini et al. ............... 711/136
5,915,167 A  *  6/1999  Leedy ........................ 438/108
6,034,882 A      3/2000  Johnson et al.
6,125,052 A  *  9/2000  Tanaka .................. 365/185.03
6,340,588 B1 *  1/2002  Nova et al. ............... 435/287.1
6,385,074 B1    5/2002  Johnson et al.
6,407,953 B1    6/2002  Cleeves et al.
6,420,215 B1    7/2002  Knall et al.
6,486,728 B2   11/2002  Kleveland (Continued)

OTHER PUBLICATIONS

"An Improved Method for Making High-Density Nonvolatile Memory," U.S. Appl. No. 10/326,470, Inventors: S. Brad Herner, Maitreyee Mahajani, and Michael A. Vyvoda, filed Dec. 19, 2002.

(Continued)

*Primary Examiner*—Cynthia Britt
(74) *Attorney, Agent, or Firm*—Brinks Hofer Gilson & Lione

(57) ABSTRACT

In one embodiment, a chip-level architecture is provided comprising a monolithic three-dimensional write-once memory array and at least two of the following system blocks: an Error Checking & Correction Circuit (ECC); a Checkerboard Memory Array containing sub arrays; a Write Controller; a Charge Pump; a Vread Generator; an Oscillator; a Band Gap Reference Generator; and a Page Register/Fault Memory. In another embodiment, a chip-level architecture is provided comprising a monolithic three-dimensional write-once memory array, ECC, and smart write. The monolithic three-dimensional write-once memory array comprises a first conductor, a first memory cell above the first conductor, a second conductor above the first memory cell, and a second memory cell above the second conductor, wherein the second conductor is the only conductor between the first and second memory cells.

14 Claims, 36 Drawing Sheets

U.S. PATENT DOCUMENTS

| | | |
|---|---|---|
| 6,504,753 B1 | 1/2003 | Scheuerlein et al. |
| 6,515,904 B2 | 2/2003 | Moore et al. |
| 6,522,594 B1 | 2/2003 | Scheuerlein |
| 6,525,953 B1 | 2/2003 | Johnson et al. |
| 6,661,730 B1 | 12/2003 | Scheuerlein et al. |
| 6,903,427 B2 * | 6/2005 | Zhang ........................ 257/391 |
| 2002/0081782 A1 | 6/2002 | Cleeves |
| 2002/0083390 A1 | 6/2002 | Lee et al. |
| 2002/0136045 A1 | 9/2002 | Scheuerlein |
| 2002/0136047 A1 | 9/2002 | Scheuerlein |
| 2002/0136076 A1 | 9/2002 | Kleveland et al. |
| 2003/0115514 A1 | 6/2003 | Ilkbahar et al. |
| 2003/0115518 A1 | 6/2003 | Kleveland et al. |
| 2003/0120858 A1 | 6/2003 | March et al. |
| 2003/0128581 A1 | 7/2003 | Scheuerlein et al. |
| 2004/0002186 A1 | 1/2004 | Vyvoda et al. |
| 2004/0027855 A1 | 2/2004 | Kleveland et al. |

OTHER PUBLICATIONS

"Current Sensing Method and Apparatus Particularly Useful for a Memory Array of Cells Having Diode-Like Characteristics," U.S. Appl. No. 09/896,468, Inventor. Roy E. Scheuerlein, filed Jun. 29, 2001.

"512Mb PROM with 8 Layers of Antifuse/Diode Cells," presented as ISSCC 2003/Session 16/Non-Volatile Memory/Paper 16.4 at the 2003 IEEE International Solid-State Circuits Conference (3 pages).

* cited by examiner

Agenda

- Memory cell
- Fabrication process
- Device organization
- Write operation
- Read operation
- Bit area comparison
- Summary

*Fig. 1*

Memory Cell (2/3)

- Cells built from polycrystalline silicon.

- Stacked for maximum density.

Process Highlights

- 0.25μm Nwell CMOS:
  - Single 17.5nm gate oxide;
  - 2 tungsten layers ("R1" and "R2") for transistor interconnect.

- 8-high stack of memory cells:
  - 5 wordline layers, 4 bitline layers;
  - Cell is 0.50μm x 0.50μm x (1/8);
  - Vias from array to CMOS.

- 1 Al layer for bond pads, global signals and power distribution.

Fig. 5

- Vertical interconnects span 3 memory layers; 4 via masks service 9 layers.

Tile Organization

- Cells built in 1MB sub-arrays ("Tiles"):
  - 1024 wordlines x 1024 bitlines x 8 layers;
  - Additional wordlines and bitlines for test and repair.

- Row and column decoders, bias circuits, and sense amplifiers laid out beneath the 1MB Tiles.

- 2+ε transistors per memory line, where ε is the amortized cost of the decoders and bias circuits.

Fig. 8

Die Organization (1/3)

- 1MB Tiles organized in a "Checkerboard" pattern.
- Checkerboard design maximizes row and column decoder sharing.
- 1MB Tile size chosen for optimum power / BW / programmability / density.

Die Organization (3/3)

- Chip contains 8 horizontal Stripes, with 9 Tiles/Stripe.
- User pages are distributed among 8 Tiles in a Stripe.
- 9th Tile in each Stripe is dedicated to ECC.

Fault Tolerance

- Single-bit correction, double-bit detection ECC included on the die:
  - (72,64) Hamming code protection on each 64-bit "octbyte";
  - 8 additional syndrome bits per 64 user bits;
  - ECC is performed 100% on-chip; external system is unaware of ECC operations.
- Flexible row repair allows factory or on-the-fly (field) replacement.

*Fig. 12*

Write Operation (2/2)

- Smart Write block:
  - Skips over "1" bits;
  - Uses the read sense amp to dynamically detect when an antifuse ruptures;
  - Immediately proceeds to the next bit, accelerating writes.
  - Detects programming fails.
- More than one fail in an ECC word (8B data + 1B ECC) initiates reprogramming to a redundant page location.

*Fig. 15*

Read Operation

- Wordline = 2.4V = "Vread".
- Bitline = Dummy bitline = 0.4V:
  - Dummy bitline provides common mode cancellation of array noise.
- Current-mode sensing:
  - Active mirror clamps memory cell voltage to 2.0V, cell current is compared to IREF.
- 72 sense amps active simultaneously:
  - All 9 Tiles in a Stripe are active;
  - Memory cells above Row Tiles are read with sense amps located in adjacent Stripes.

Fig. 16

Device Characteristics

| Technology | 0.25um CMOS, Tox = 17.5nm |
|---|---|
| Cell type | OTP, diode+antifuse, 0 transistors |
| Cell size | 0.50um X 0.50um |
| Chip size | 6.7mm X 7.2mm = 48.3mm$^2$ |
| Wiring | 2 layers W + 1 layer Al |
| Power | VDD = 2.7 – 3.6V   IDD = 30mA |
| Bandwidth | 1.0 MB/s read, 0.5 MB/s write |
| Organization | 128K pages X (512 + 16) bytes/page |
| Fault tolerance | (72,64) modified Hamming ECC |
| Application | Digital media, handhelds, file storage |

Fig. 22

Summary

- 3-dimensional memory array with cells vertically stacked 8-high.
- Two terminal, antifuse/diode memory cell built in polysilicon.
- 512 Mbit PROM, generic NAND Flash interface.
- SEC-DED ECC included on-die.
- 3.3x more bits per $F^2$ than MLC NAND Flash.

Fig. 23

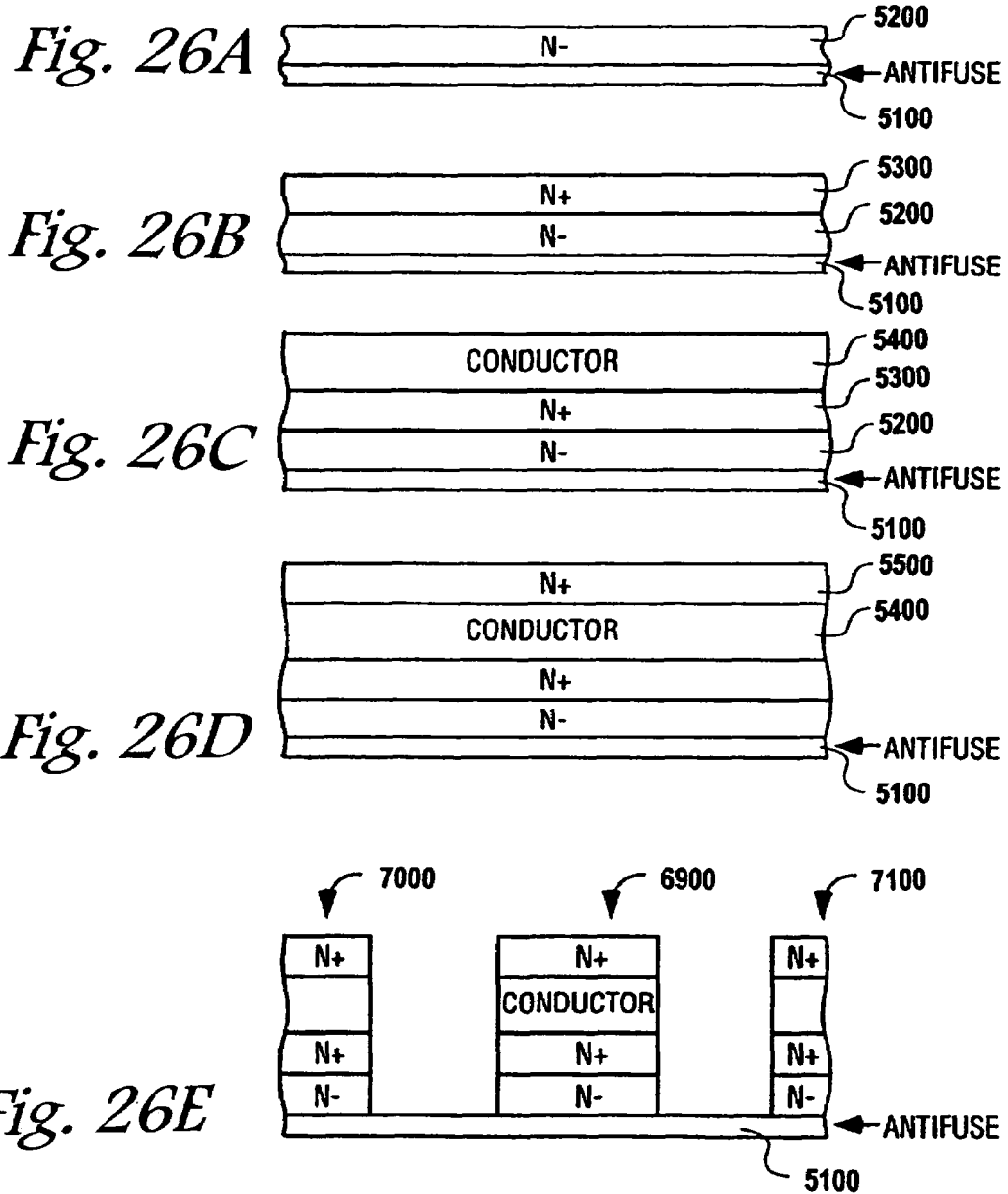

SYSTEM ARCHITECTURE AND METHOD FOR THREE-DIMENSIONAL MEMORY

CROSS-REFERENCE TO RELATED APPLICATION

This application claims the benefit of U.S. provisional application No. 60/446,910, filed Feb. 11, 2003, which is hereby incorporated by reference.

BACKGROUND

Field of the Invention

This invention is directed to a chip-level architecture used in combination with a monolithic three-dimensional write-once memory array.

BRIEF DESCRIPTION OF THE DRAWINGS

FIG. 1 is a drawing labeled "Agenda.
"
FIG. 5 is a drawing labeled "Process Highlights.
"
FIG. 8 is a drawing labeled "Tile Organization.
"
FIG. 12 is a drawing labeled "Fault Tolerance.
"
FIG. 15 is a drawing labeled "Write Operation (2/2).
"
FIG. 16 is a drawing labeled "Read Operation.
"
FIG. 22 is a drawing labeled "Device Characteristics.
"
FIG. 23 is a drawing labeled "Summary.
FIGS. 26A-26H illustrate some of the steps used to fabricate one embodiment of the invented memory.
FIG. 26A is a cross-sectional elevation view of an antifuse and semiconductor layer formed during the fabrication of the invented array.
FIG. 26B illustrates the structure of FIG. 26A after an additional semiconductor layer has been formed.
FIG. 26C illustrates the structure of FIG. 26B after a conductive layer is formed.
FIG. 26D illustrates the structure of FIG. 26C after an additional semiconductor layer has been formed.
FIG. 26E illustrates the structure of FIG. 26D after a masking and etching step.
FIG. 26F illustrates the structure of FIG. 26E after open spaces left from the etching step have been filled.
FIG. 26G illustrates the structure of FIG. 26F after a planarization step.
FIG. 26H illustrates the structure of FIG. 26G after another antifuse layer is formed.

DETAILED DESCRIPTION OF THE PRESENTLY PREFERRED EMBODIMENTS

Figure 2:
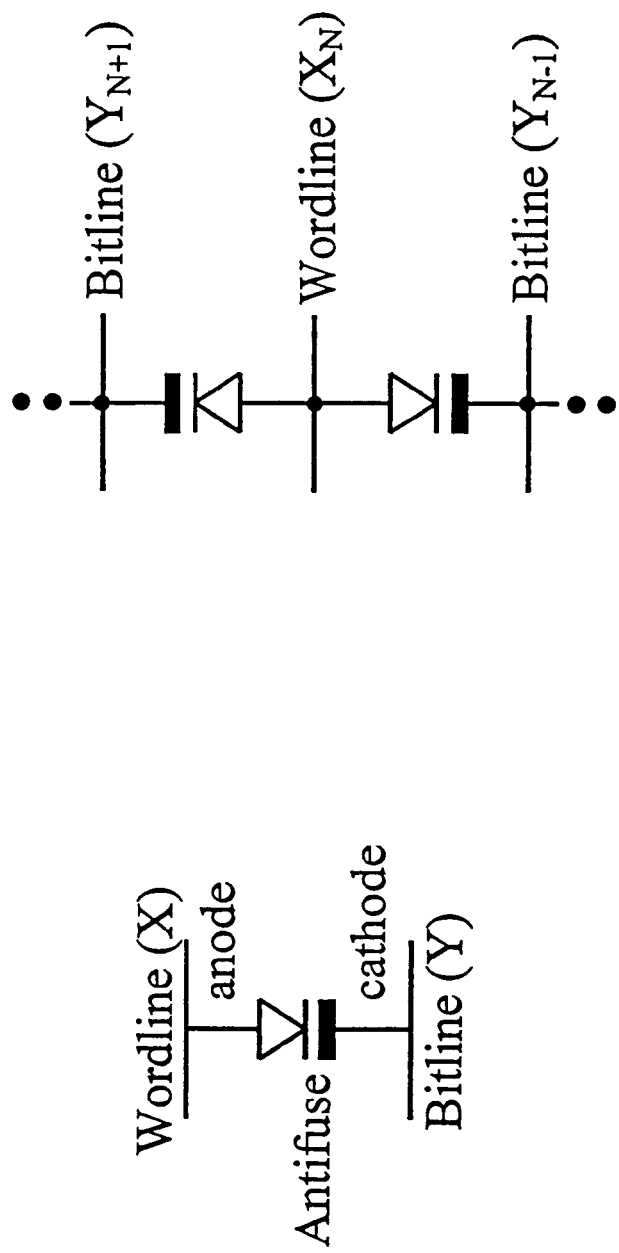
"
FIG. 2 is a drawing labeled "Memory Cell (1/3).
Figure 3:
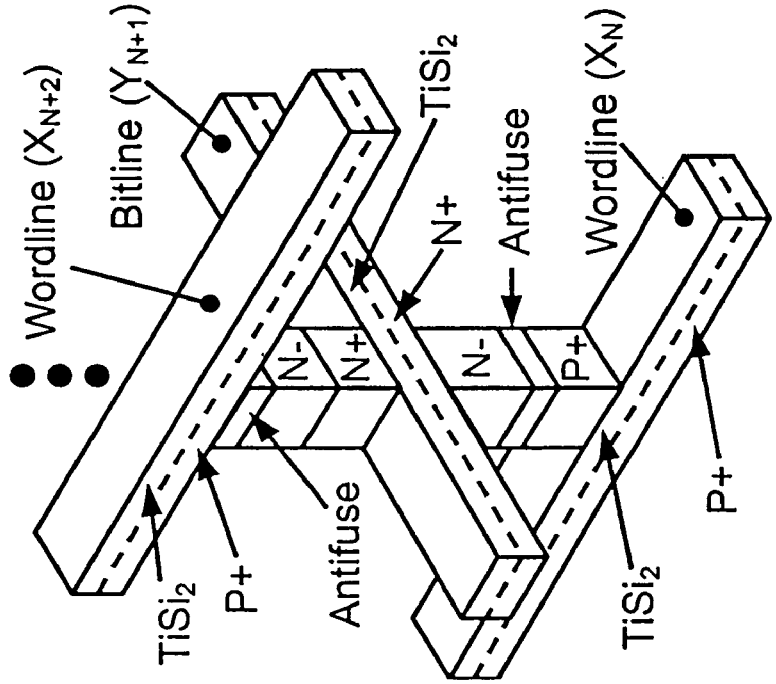
"
FIG. 3 is a drawing labeled "Memory Cell (2/3).
Figure 4:
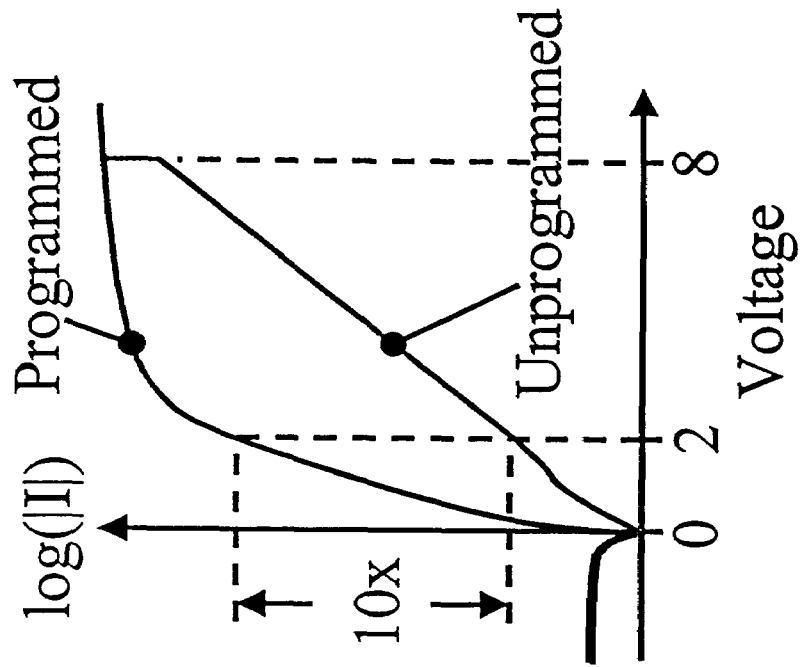
"
FIG. 4 is a drawing labeled "Memory Cell (3/3).
Figure 6:
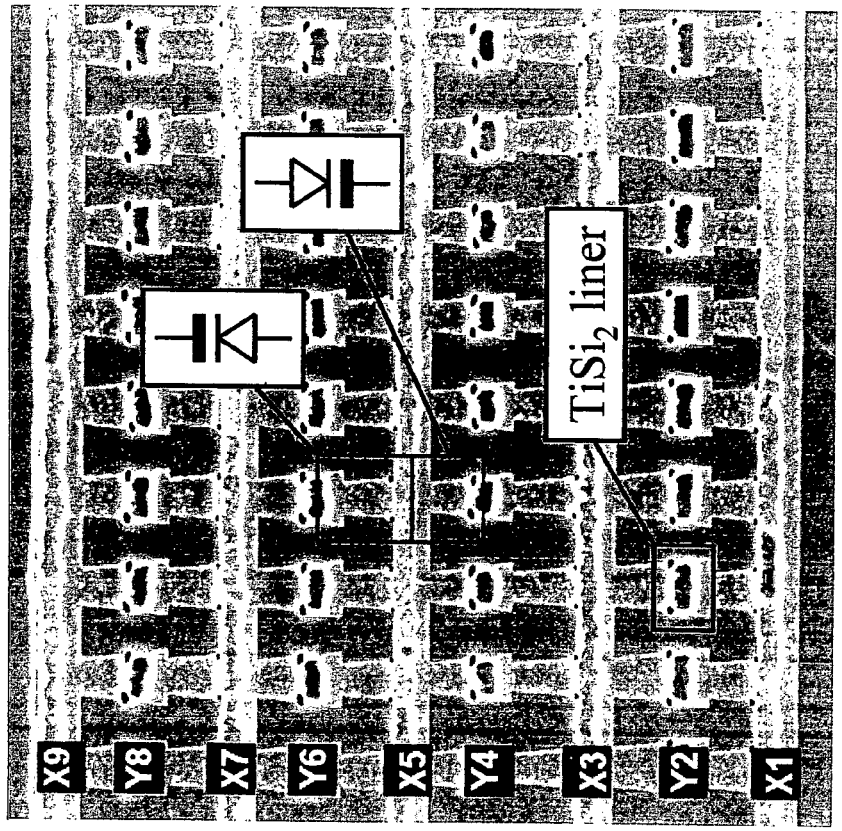
"
FIG. 6 is a drawing labeled "Array of Stacked Memory Cells.

The following 23 documents are hereby incorporated by reference:

1. "512 Mb PROM with 8 Layers of Antifuse/Diode Cells" (to be presented as ISSCC 2003/Session 16/Non-Volatile Memory/Paper 16.4 at the 2003 IEEE International Solid-State Circuits Conference (3 pages)).
2. 23 pages of slides (first slide labeled "Agenda;" last slide labeled "Summary"), which are reproduced herein as FIGS. 1-23.
3. U.S. Pat. No. 6,034,882 to Johnson et al. ("Vertically Stacked Field Programmable Nonvolatile Memory and Method of Fabrication").
4. U.S. Pat. No. 6,420,215 to Knall et al. ("Three Dimensional Memory Array and Method of Fabrication").
5. U.S. Pat. No. 6,525,953 to Johnson ("Vertically-Stacked, Field Programmable, Nonvolatile Memory and Method of Fabrication").
6. U.S. Pat. No. 6,952,043 to Vyvoda et al. ("Electrically Isolated Pillars in Active Devices").
7. U.S. patent application Ser. No. 10/326,470 to Herner et al. ("An Improved Method for Making High-Density Nonvolatile Memory").
8. U.S. Patent Application Publication No. US 2003-0120858 A1 to March et al. ("Memory Devices and Methods for Use Therewith").
9. U.S. Pat. No. 6,534,403 ("Contact and Via Structure and Method of Fabrication").
10. U.S. Pat. No. 6,574,145 ("Memory Device and Method for Sensing while Programming a Non-Volatile Memory Cell").
11. U.S. Pat. No. 6,567,287 ("Memory Device with Row and Column Decoder Circuits Arranged in a Checkerboard Pattern under a Plurality of Memory Arrays").
12. U.S. Pat. No. 6,928,590 ("Memory Device and Method for Storing Bits in Non-Adjacent Storage Locations in a Memory Array").
13. U.S. Patent Application Publication No. US 2003-0115518 A1 ("Memory Device and Method for Redundancy/Self-Repair").
14. U.S. Pat. No. 6,591,394 ("Three-Dimensional Memory Array and Method for Storing Data Bits and ECC Bits Therein").

15. U.S. Pat. No. 6,486,728 to Kleveland ("Multi-Stage Charge Pump").
16. U.S. Pat. No. 6,385,074 to Johnson et al. ("Integrated Circuit Structure Including Three-Dimensional Memory Array").
17. U.S. Pat. No. 6,661,730 to Scheuerlein et al. ("Partial Selection of Passive Element Memory Cell Sub-Arrays for Write Operation").
18. (a) U.S. Pat. No. 6,618,295 to Scheuerlein ("Method and Apparatus for Biasing Selected and Unselected Array Lines when Writing the Memory Array"). (b) U.S. Pat. No. 6,504,753, which has the same specification (excluding the claims).
19. (a) U.S. patent application Ser. No. 09/896,468 to Scheuerlein ("Current Sensing Method and Apparatus Particularly Useful for a Memory Array of Cells Having Diode-Like Characteristics"). (b) U.S. Pat. No. 6,522,594 to Scheuerlein ("Memory Array Incorporating Noise Detection Line"), which has the same specification (excluding the claims).
20. U.S. Pat. No. 6,407,953 to Cleeves et al. ("Memory Array Organization and Related Test Method Particular Well Suited for Integrated Circuits Having Write Once Memory Arrays").
21. U.S. Pat. No. 6,515,904 to Moore et al. ("Method and System for Increasing Programming Bandwidth in a Non-Volatile Memory Device").
22. U.S. Pat. No. 6,856,572 to Scheuerlein et al. ("Multiheaded Decoder Structure Utilizing Memory Array Line Driver with Dual Purpose Driver Device").
23. U.S. Pat. No. 6,781,878 to Kleveland et al. ("A Dynamic Sub Array Group Selection Scheme").

This invention is directed to a chip-level architecture used in combination with a monolithic three-dimensional write-once memory array. For example, the architecture can be used with any of such memory devices taught in document numbers 3 through 7 in the above list.

Figure 13:
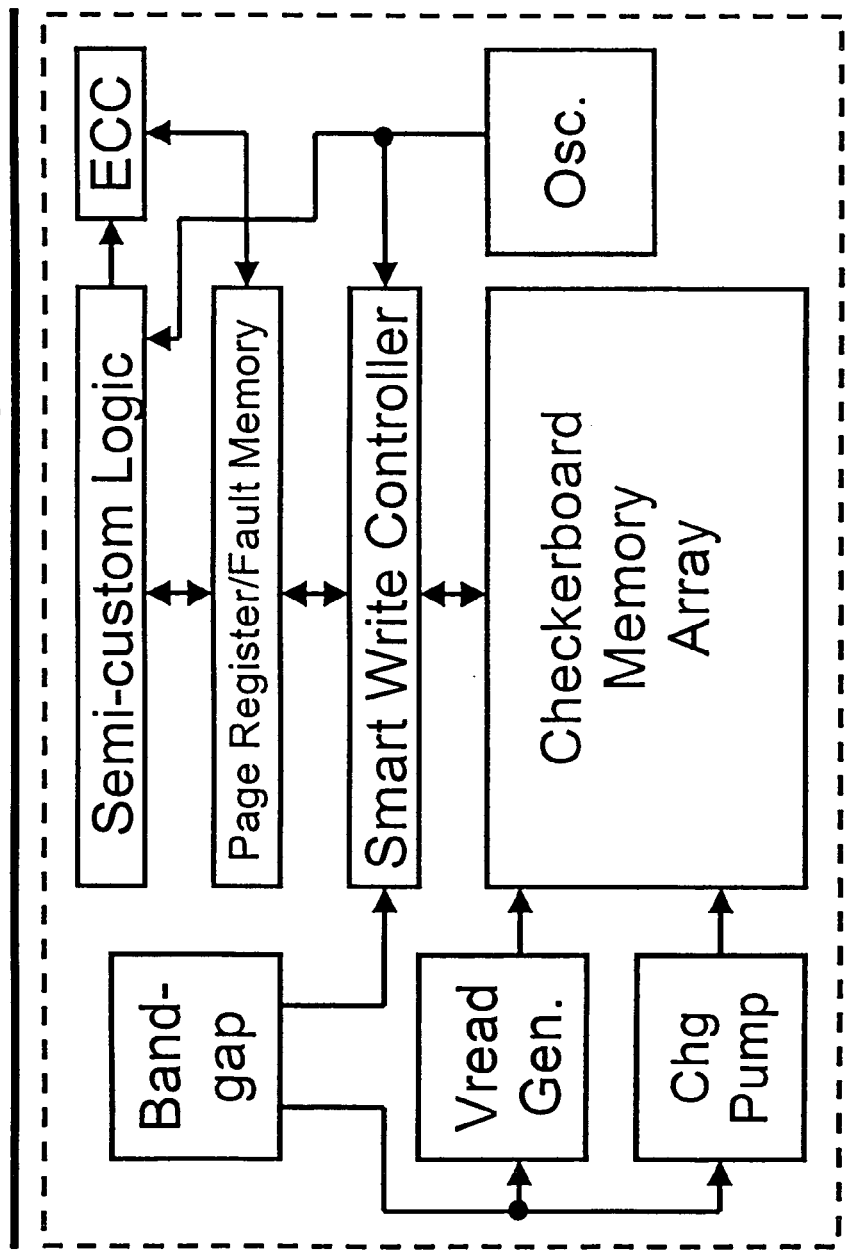
"
FIG. 13 is a drawing labeled "Chip Block Diagram.
Figure 14:
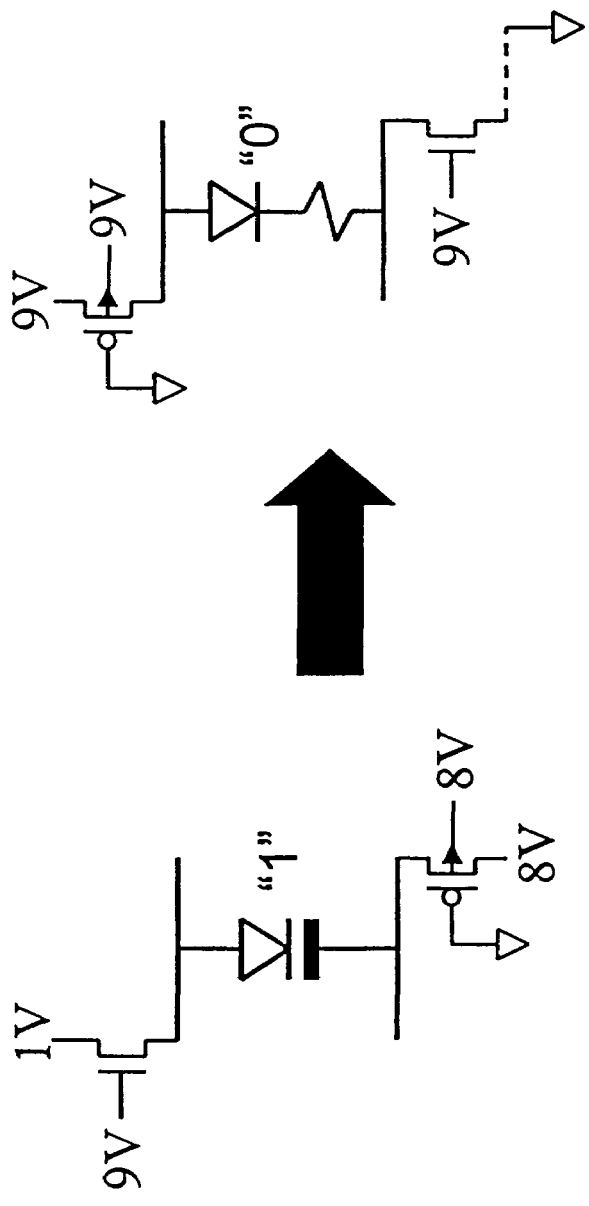
"
FIG. 14 is a drawing labeled "Write Operation (1/2).
Figure 17:
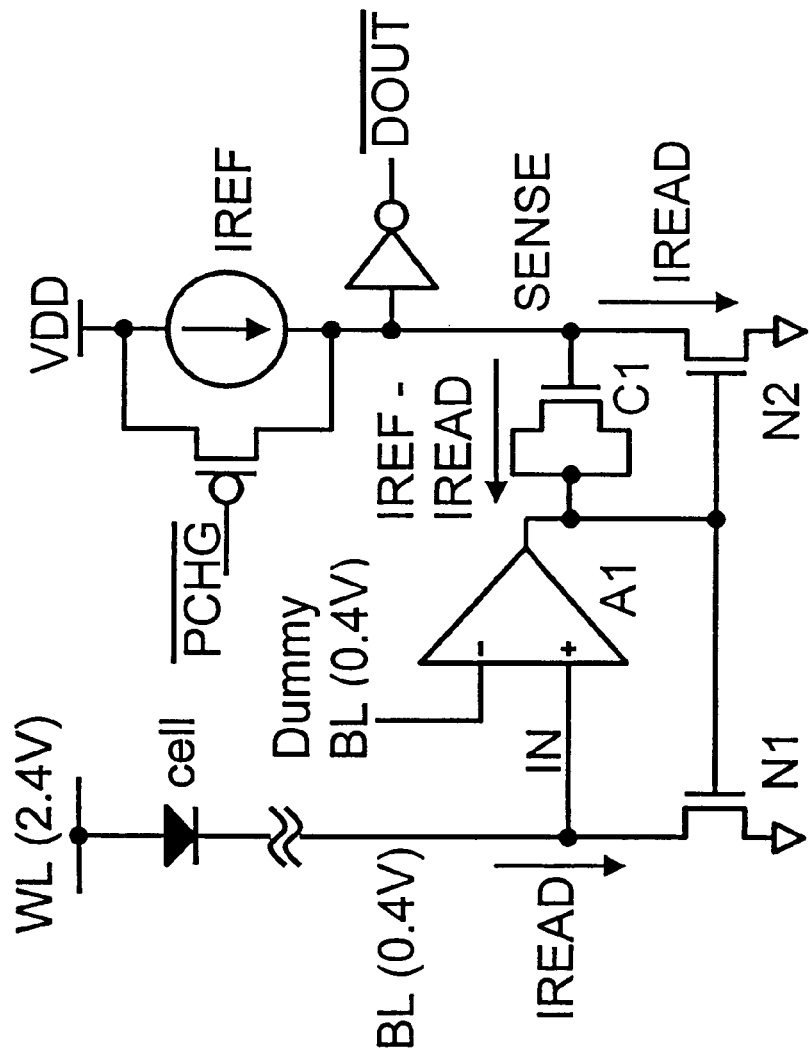
"
FIG. 17 is a drawing labeled "Read Sense Amplifier.
Figure 18:
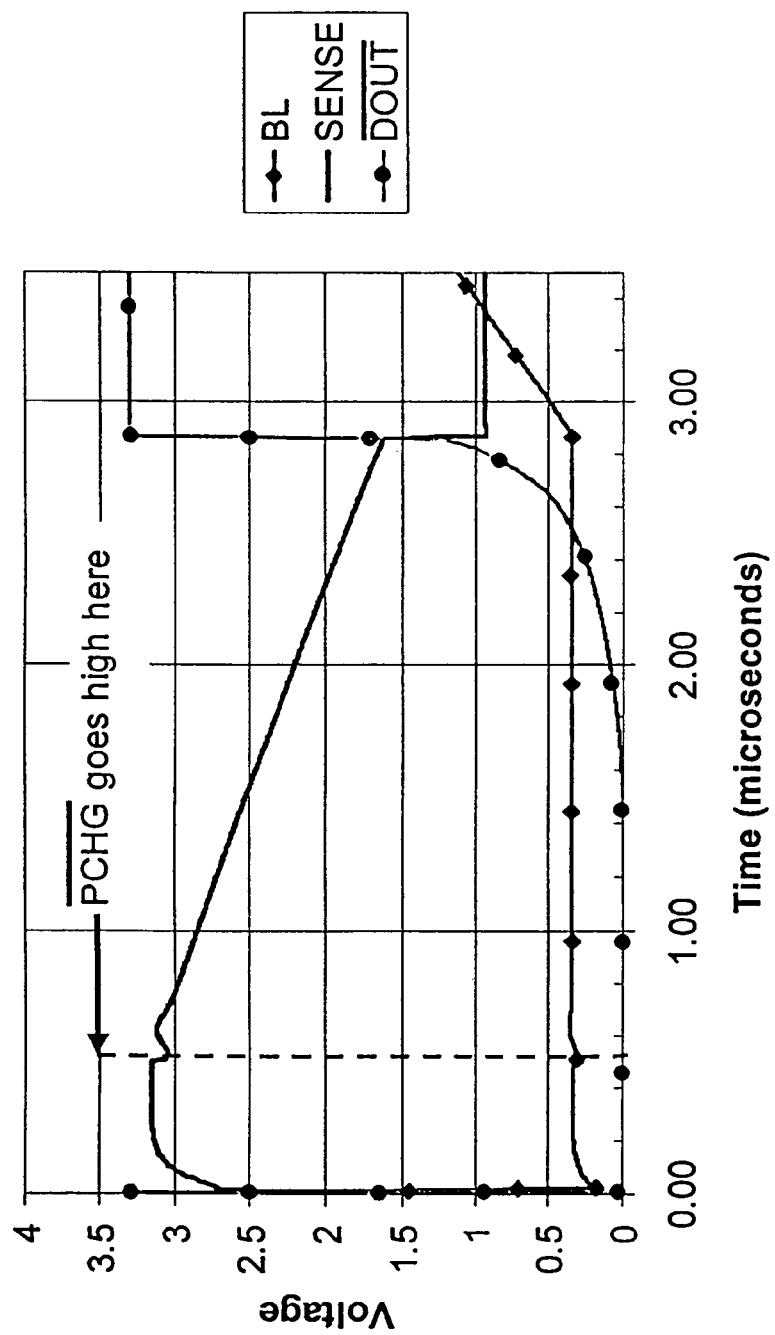
"
FIG. 18 is a drawing labeled "Sensing IREAD=300 nA.
Figure 19:
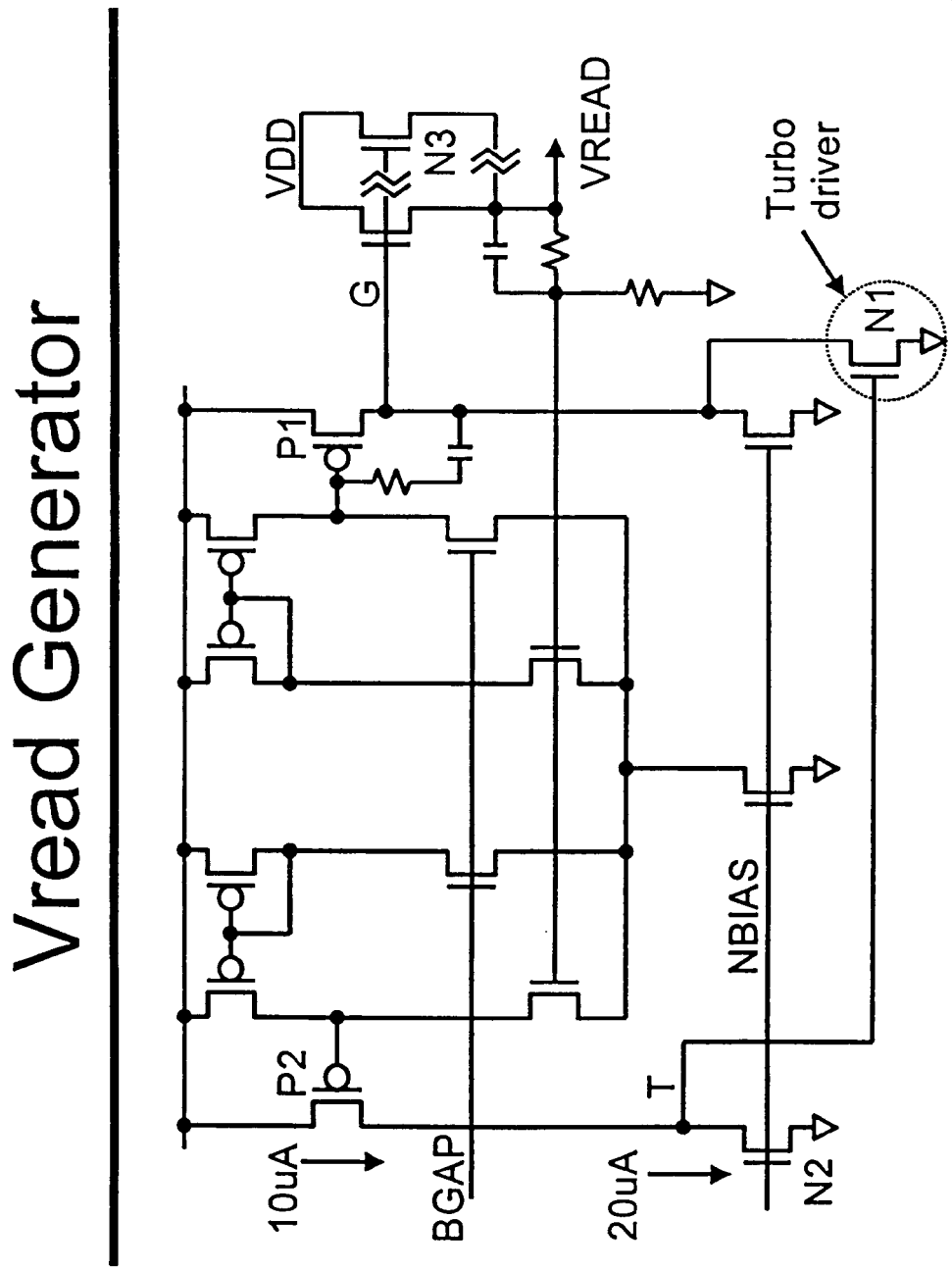
"
FIG. 19 is a drawing labeled "Vread Generator.
Figure 20:
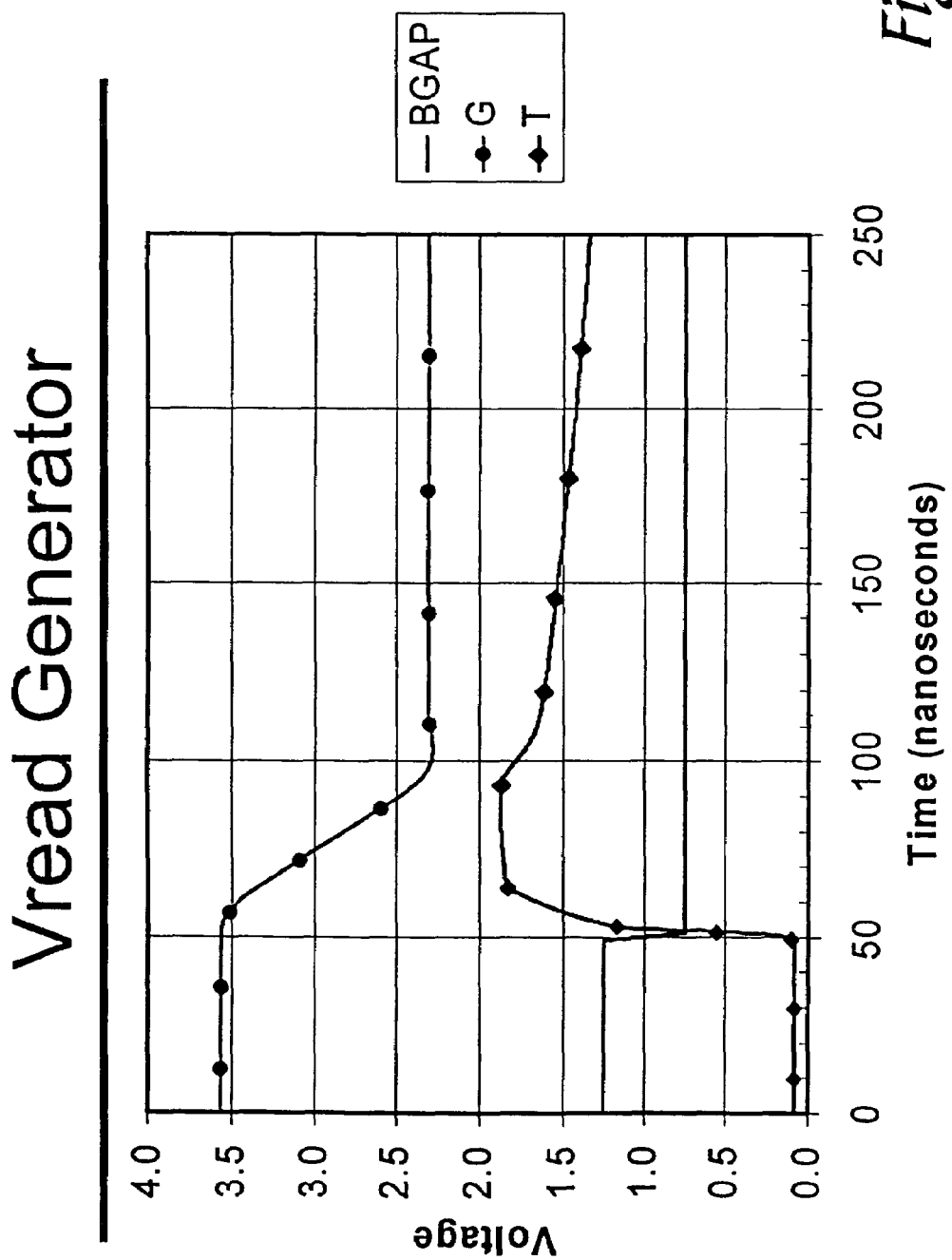
"
FIG. 20 is a drawing labeled "Vread Generator.
Figure 21:
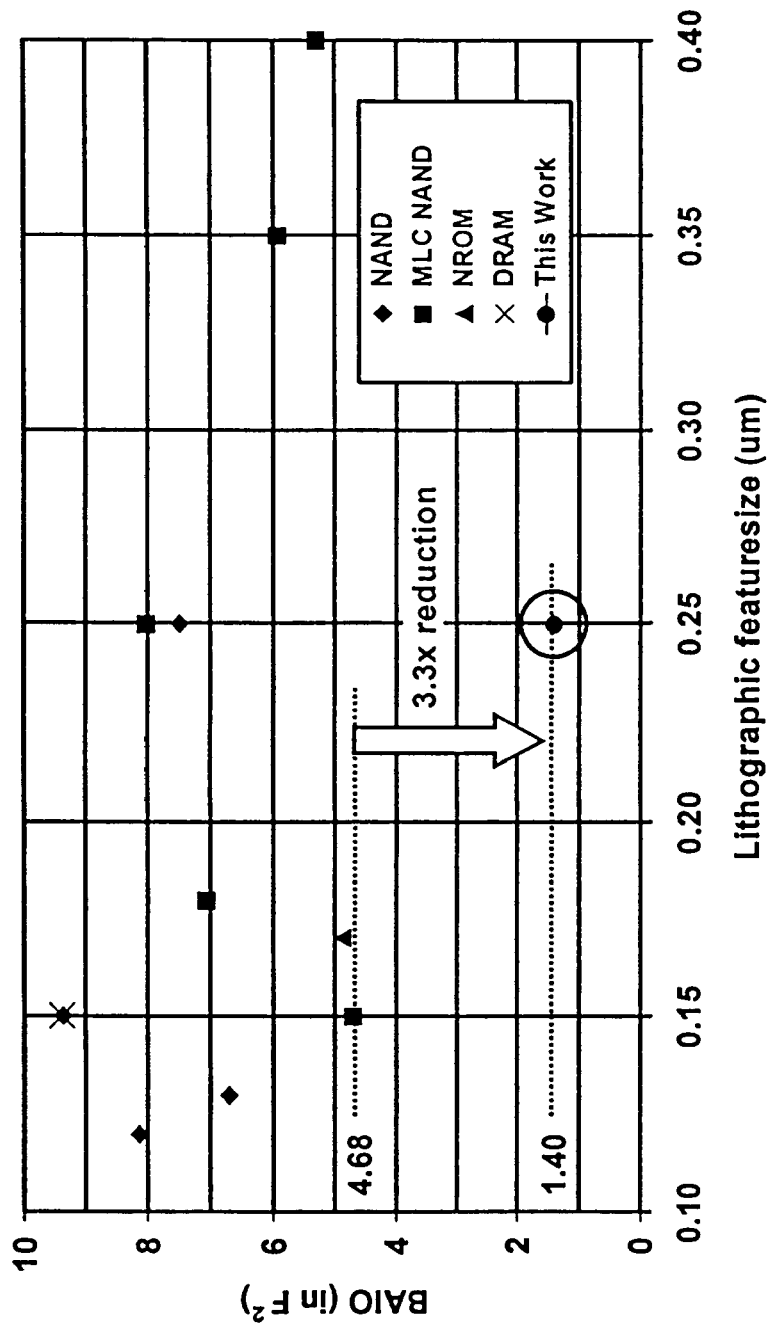
"
FIG. 21 is a drawing labeled "Bit Area Comparison.
Figure 24A:
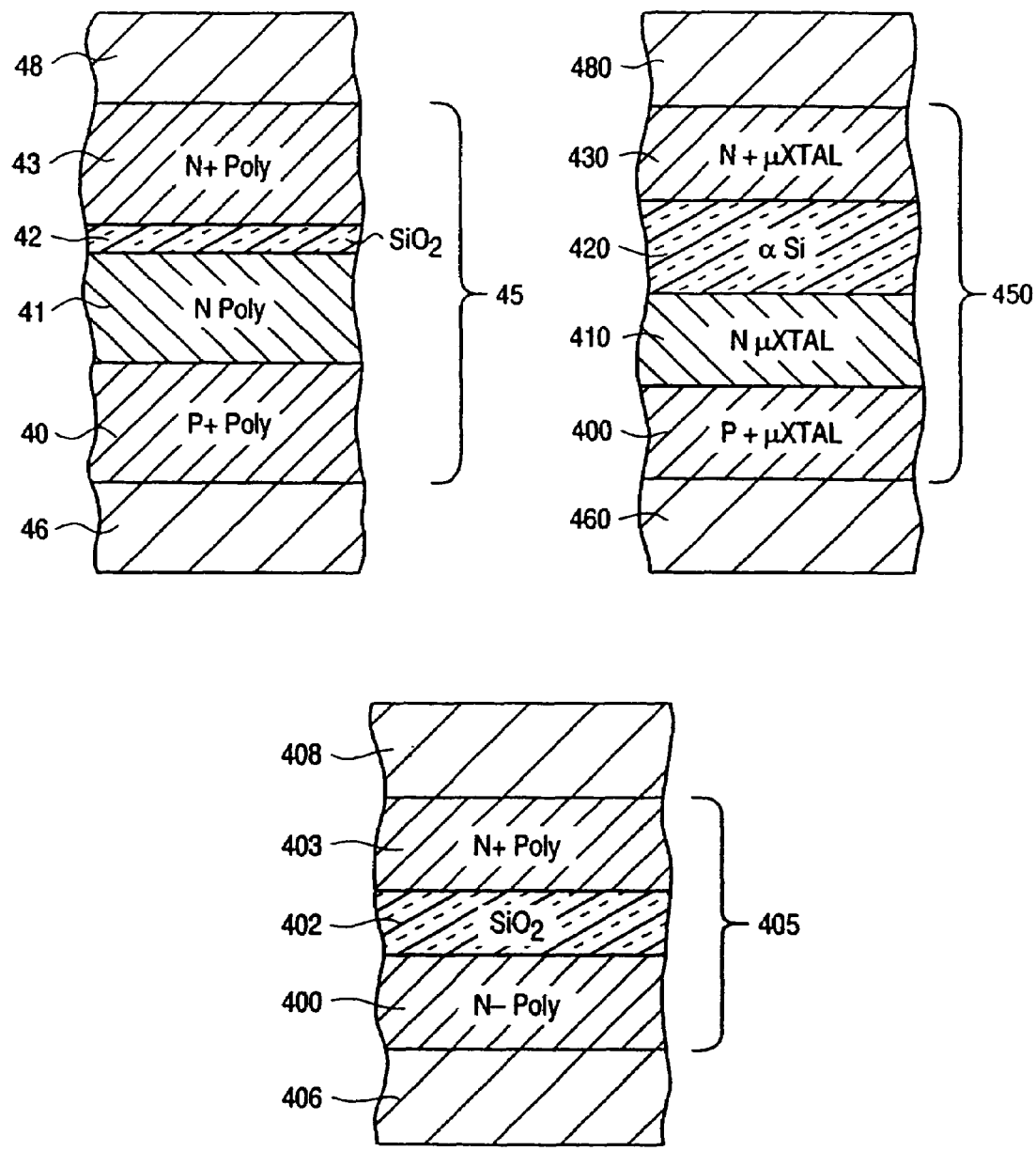
"
FIG. 24(a) shows three cross-sectional views of layers used to fabricate different embodiments of a memory cell built in accordance with the present invention.
Figure 24B:
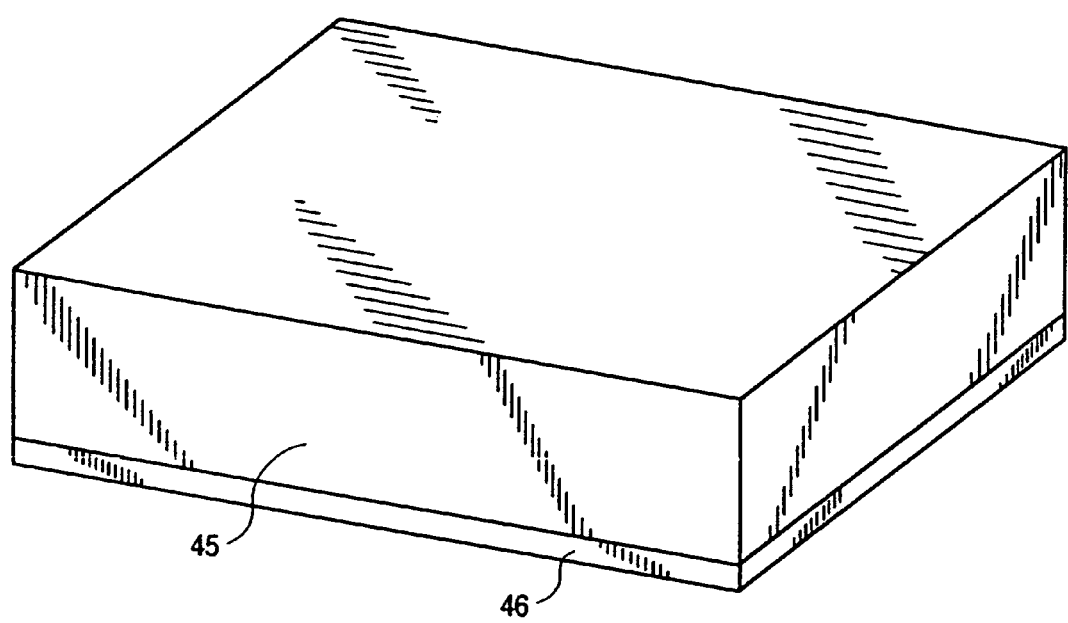
FIG. 24(b) is a perspective view of a conductor layer and layer stack used in the fabrication of a memory cell built in accordance with the present invention.
Figure 24C:
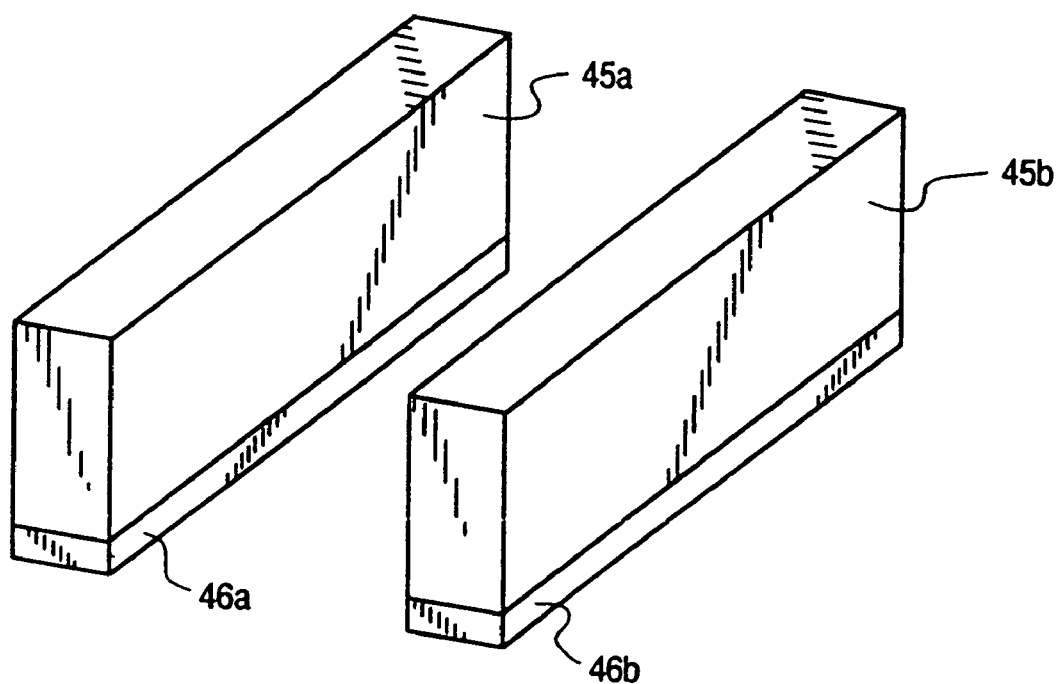
FIG. 24(c) illustrates the structure of FIG. 24(b) after patterning.
Figure 24D:
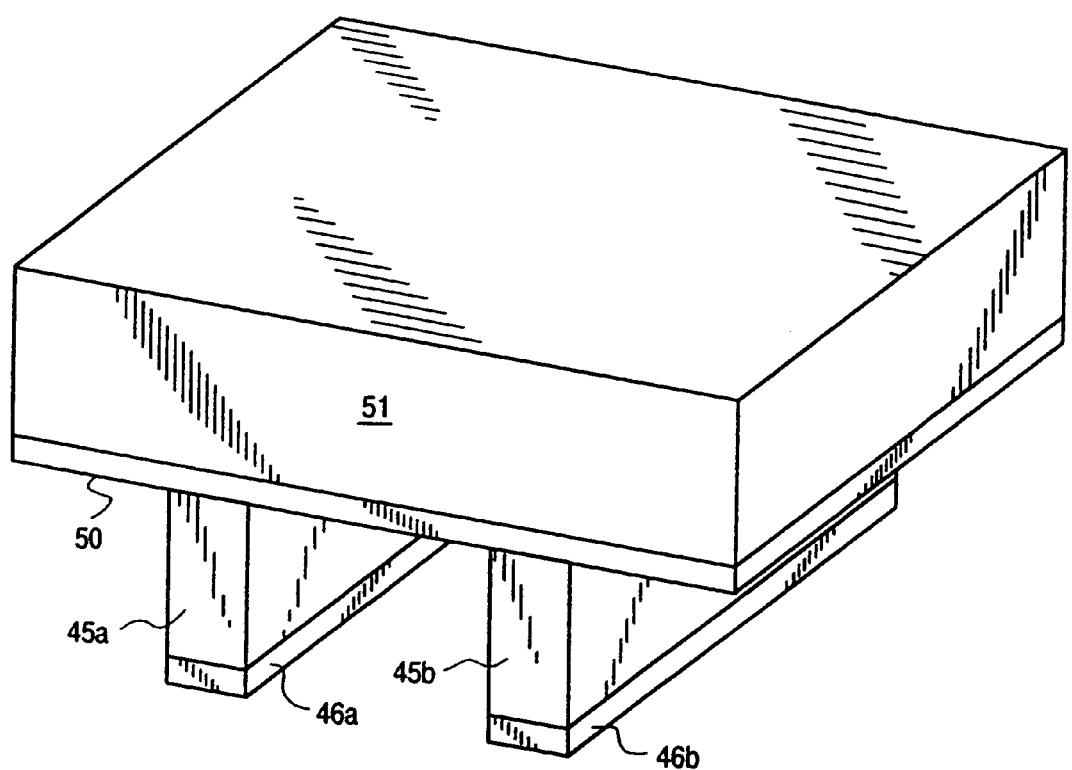
FIG. 24(d) illustrates the structure of FIG. 24(c) after an additional conductor layer and layer stack have been formed.
Figure 24E:
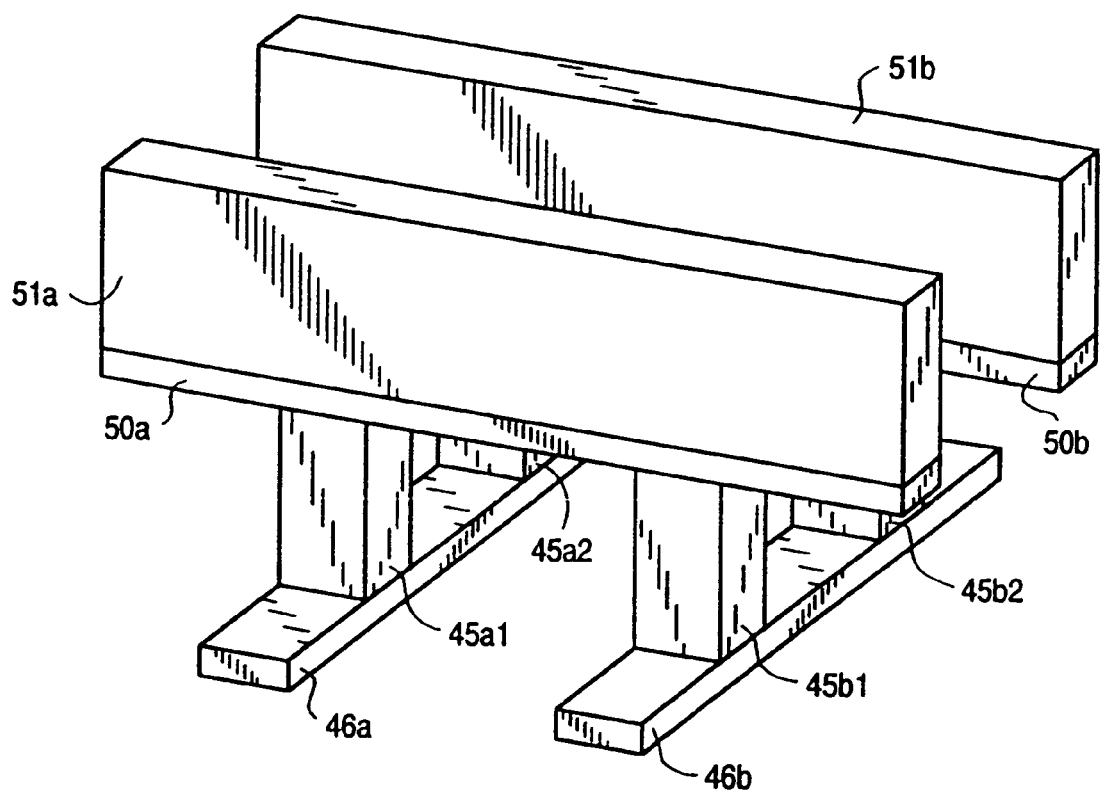
FIG. 24(e) illustrates the structure of FIG. 24(d) after patterning.
Figure 24F:
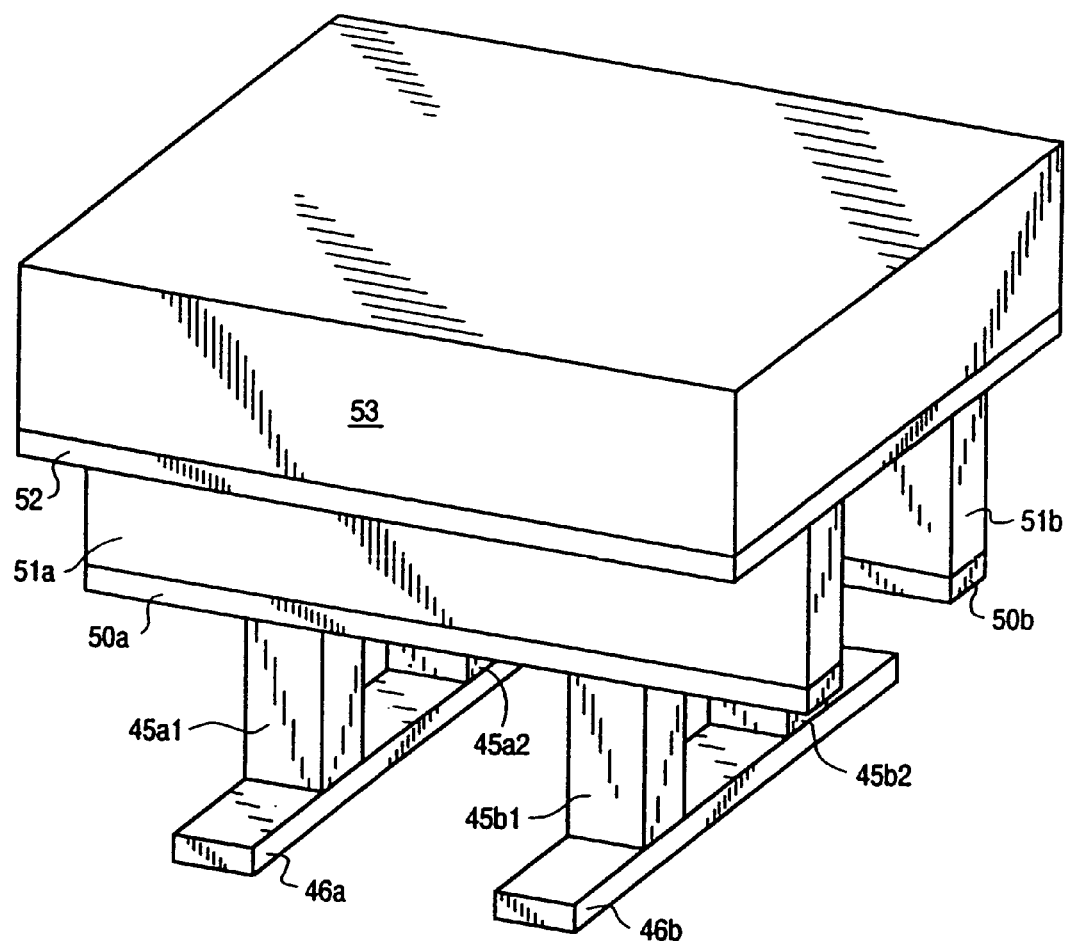
FIG. 24(f) illustrates the structure of FIG. 24(e) after an additional conductor layer and layer stack have been formed.
Figure 24G:
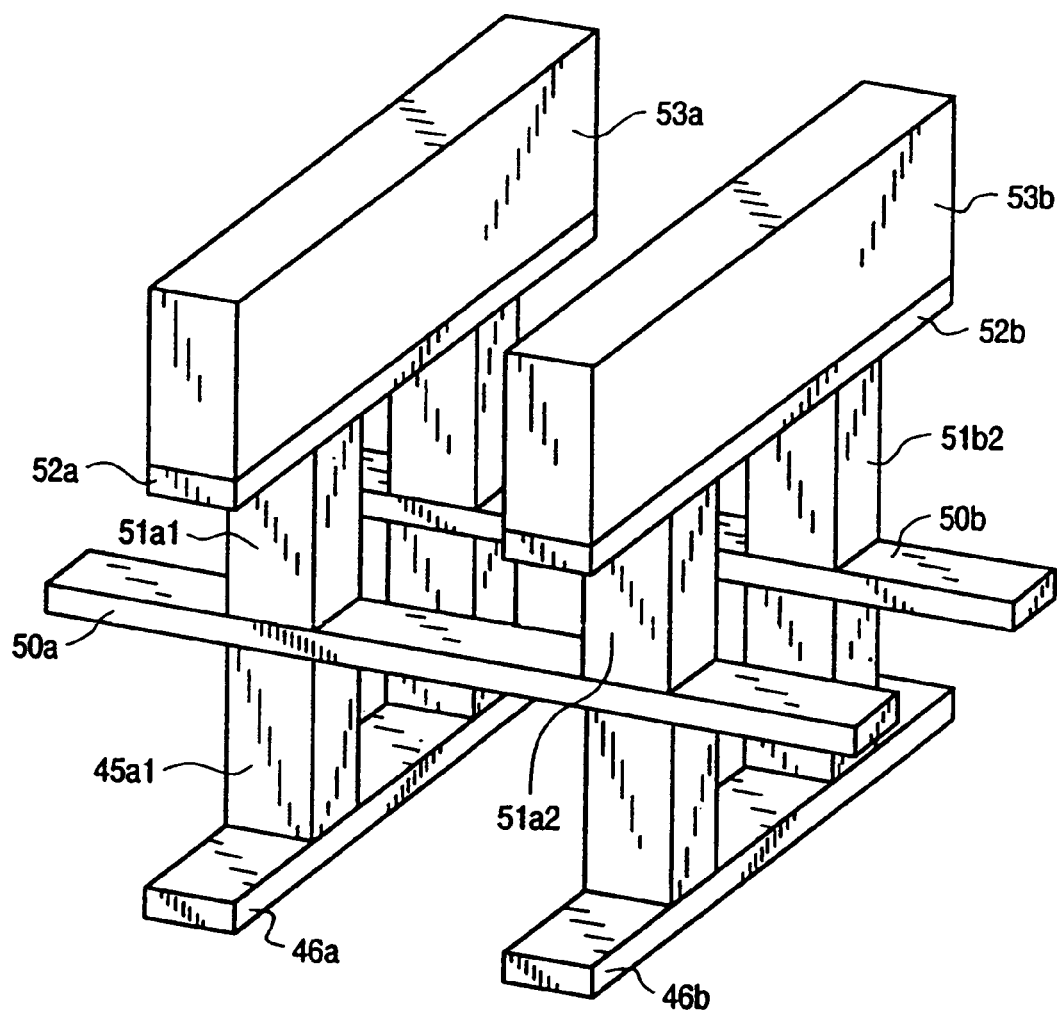
FIG. 24(g) illustrates the structure of FIG. 24(f) after another patterning step.

The Chip Block Diagram in the above-listed document number 2, which is reproduced herein as FIG. 13, exemplifies a preferred embodiment of the architecture showing the functional organization of:

an Error Checking & Correction Circuit (ECC) described in documents 8, 13, and 14 above;

a Checkerboard Memory Array described in document 11 above;

a Smart Write Controller described in documents 10, 13, and 21 above;

a Charge Pump exemplified in documents 15 and 16 above;

a Vread Generator exemplified in document 2 above with a circuit schematic (see FIGS. 19-20 herein);

an Oscillator;

a Band Gap Reference Generator (precision reference generator); and a Page Register/Fault Memory described in document 13 above.

Document numbered 17 in the above list shows the user data for one programming request stored temporarily in a register called a page register, programmed into memory cells in multiple sub arrays of the memory device.

Document numbered 18(a) in the above list describes the biasing for selected and unselected array lines of a selected sub array, unselected sub arrays have all their memory lines held to a common voltage preferably the ground voltage of the chip. Document 18(b) describes a method and apparatus for discharging memory lines of a selected sub array to the voltages required for memory lines in an unselected sub array.

Document numbered 19(a) in the above list describes current sensing method used to sense the state of memory cells on the memory lines of the sub arrays. Document numbered 19(b) in the above list describes a sub array incorporating a noise detection line used in combination with the above sensing method for reliable sensing of small signals from cells in the sub arrays.

The memory device has multiple sub arrays in a checkerboard arrangement. Circuits as described in more detail in document 18(a) are provided that bias the memory lines of selected arrays so they can be accessed for read and write operations, and other circuits as described in document 18(b) that bias the memory lines of unselected arrays so the state of cells in unselected arrays are not disturbed during read or write operations. By these means, the power dissipation of the memory device is much lower than if all cells in the memory were biased for selectivity. The number of selected sub arrays can be modified by control circuits on the memory as described in document 23 in the above list.

The sub arrays have read and write sensing circuitry connected to array lines in one direction (i.e., sensing lines). The circuitry is shared between adjacent subarrays by the method described for checkerboard arrays. The circuitry uses current sensing methods and noise cancellation lines described in documents 18 and 19, particularly the sensing circuit shown in the Read Sense Amplifier figure of document 2 (which is reproduced herein as FIG. 17) and described in document 1, to allow large sub arrays with reliable sensing. All the sensing circuits for subarrays in a column are connected together by means of shared bi-directional data busses and control lines on a layer of interconnection metal above the memory cells. The data busses and control lines are preferably substantially parallel to one another and parallel to the sensing lines in the memory array. They connect the sub arrays to control circuitry in the smart write controller. The data bus is bi-directionally controlled in both read and write operations to reduce the number of wires required. The smart write controller transfers data between the selected memory sub arrays and a register called a page register/fault memory during read and write operations. Thereby, the data from the page register is written to or read from a set of cells distributed across all the selected sub arrays.

The selected sub arrays are preferably all in a horizontal group called a stripe and within the sub arrays the selected cells are preferably all in a single row, i.e., the row decoders in each of the selected sub arrays are coordinated. One of the sub arrays contains the calculated bits for ECC protection of the data as described in document 14. Two other sub arrays located at the left and right ends of the horizontal stripe, and preferably smaller than the user data subarrays, contains supplemental data including flags and other redundancy control bits that thereby can be located in the same single row with the user data. Preferably, each row contains the page register data, as well as ECC data and redundancy control bits. The spreading of the data to many sub arrays improves the effectiveness of the ECC and the coordination of the row decoders facilitates a self-repair mechanism further described in document 13.

The smart write control circuitry achieves variable bandwidth transfers to the sub arrays as described in document 17 and 23. The smart write control circuitry also collects detected errors during programming using the method described in document 10 and steers them to the fault memory portion of the register to activate the self repair mechanism which will reprogram the data from the page register in a row of redundant cells preferably in the same set of selected sub arrays.

The exemplary Vread Generator provides a voltage to which a selected word line is driven during a read operation. Pairs of transistors, labeled N3, per collection of sub-arrays are preferably spatially distributed throughout the die to achieve reduced voltage drop along the reference node Vread. This Vread generator, which provides a voltage to which a word line is driven in a 3-D array, having a distributed portion and a localized portion, can be used alone or in combination with any other elements disclosed herein. It is further described in document number 1 in the above-identified list.

Figure 10:
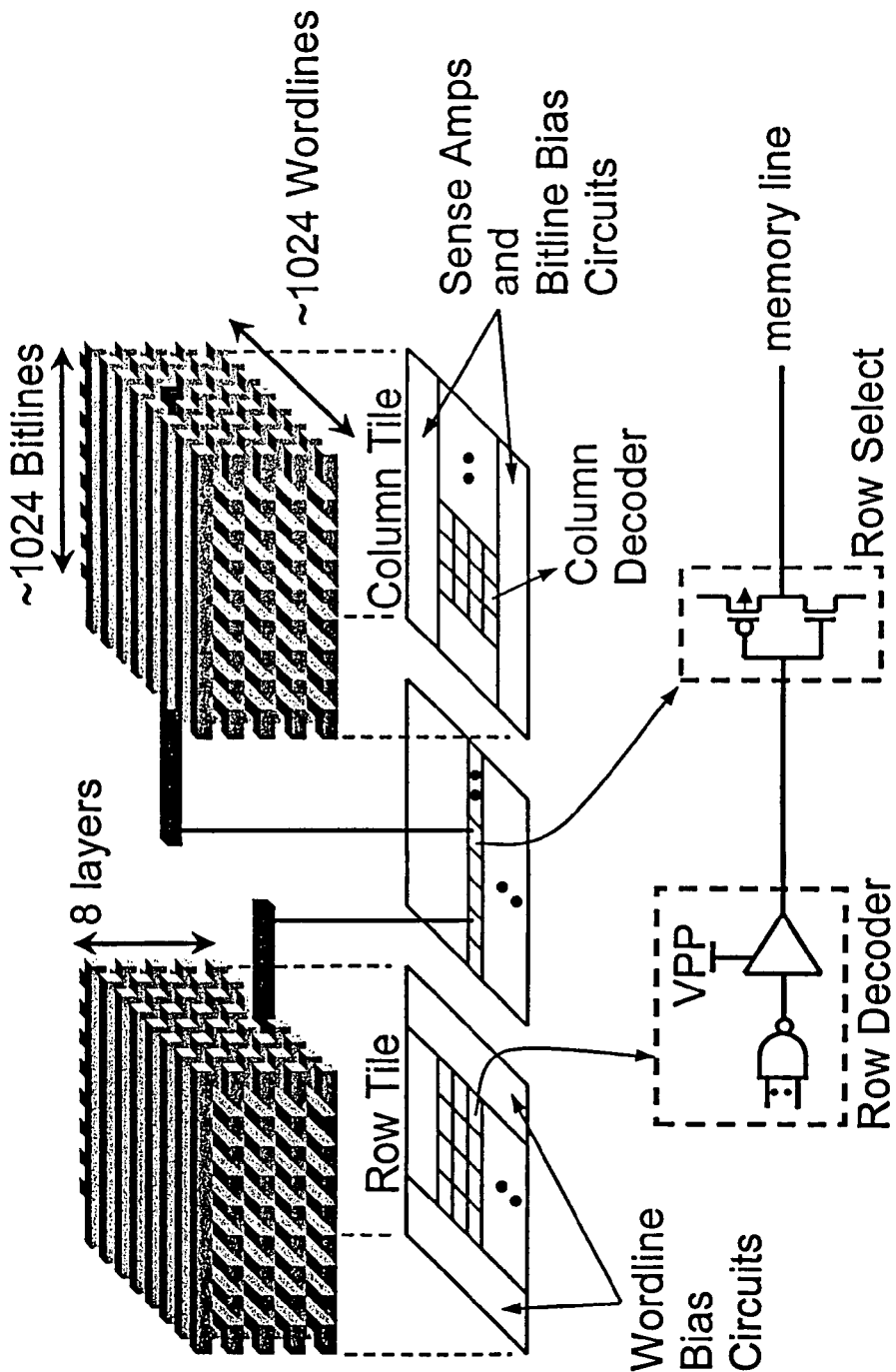
"
FIG. 10 is a drawing labeled "Die Organization (2/3).
Figure 11:
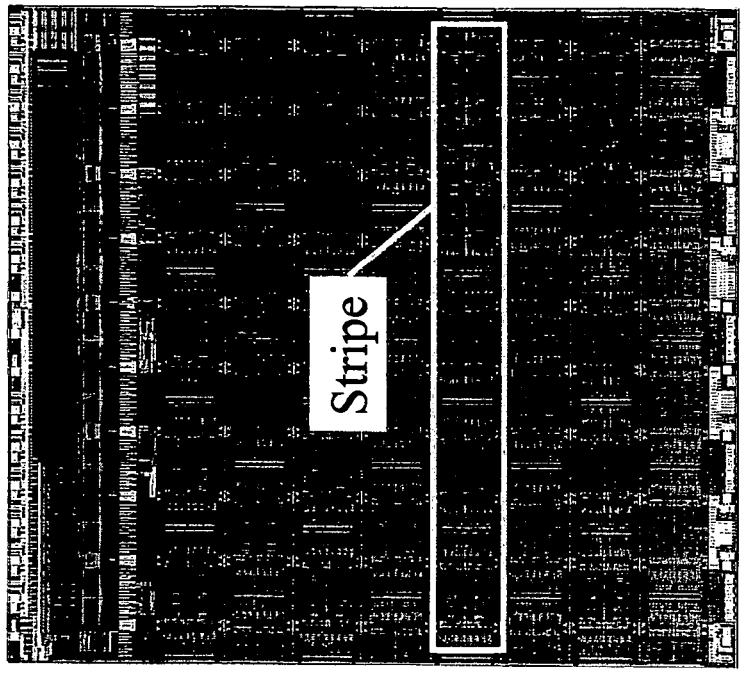
"
FIG. 11 is a drawing labeled "Die Organization (3/3).

Each memory line has two control transistors, as shown in document 2, the foil titled, "Die Organization 2/3, which is reproduced herein as FIG. 10." These are the "two transistors" referred to in the "Tile Organization" foil of document 2, which is reproduced herein as FIG. 8, while "epsilon" is the amortized cost of the row decoders and bias circuits. This die organization can be used alone or in combination with any other elements disclosed herein.

Other combinations of particular interest include, as examples, 3-Dimensional

Memory with:
1. Smart write controller and oscillator.
2. Smart write controller, a collection of memory subarrays, and a bi-directional connection between the memory subarrays and the smart write controller.
   a. Where in a preferred embodiment, during a write operation, information is transferred bi-directionally, specifically, data is transferred to the subarray for programming cells in the subarray and programming success is indicated to the smart write controller on the bi-directional connection.
3. Smart write and checkerboard.
   a. Where in a preferred embodiment, wiring above memory cells connects the subarrays to the write controller.
   b. Where in a preferred embodiment, a bi-directional connection is used between the memory subarrays and the smart write controller.
4. Set of selected subarrays containing the combination of user data, ECC data, and redundancy control bits
5. Checkerboard and ECC.
6. ECC and smart write.
7. ECC and on-the-fly redundancy.
8. Vread generator with distributed output.
9. Smart write plus dummy bit lines.
10. Data from the page register is distributed in a corresponding physical row in each of the subarrays
    a. Preferably, each row contains the page register data, as well as ECC data and redundancy control bits.
11. Die organization having two control (driver) transistors per memory line, plus row decoders and bias circuits that are shared amongst memory lines, details of which are provided in document numbered 22 above, optionally in combination with smart write.

Three-Dimensional Memory Devices

Pillar Three-Dimensional Memory Devices

In one embodiment of the present invention, a conductor layer (say, conductor layer number J) runs north-to-south, and adjacent conductor layers (numbers J−1 and J+1) run east-to-west. Wherever a conductor's vertical projection on layer (J) crosses over a conductor on layer (J−1), a memory cell pillar is created. Similarly, wherever a conductor's projection on layer (J+1) crosses a conductor on layer (J), a memory cell pillar is created. Memory cell pillars are defined and patterned by the intersection (crossover) of the conductors, and so the pillars are selfaligned to the conductors. Selfalignment is an extremely important advantage, because it lets the photolithographic patterns of the memory cell be designed without including any extra allowance for misalignment tolerances. Thus the pattern features of our selfaligned memory cell may be made smaller, resulting in a smaller cell area, which gives higher density and lower cost.

For purposes of illustrating the selfaligned fabrication of these pillars, consider an embodiment which uses four sequential layers of material (a "layer stack") to fabricate the steering element and the state change element. In this illustrative example the steering element consists of a polycrystalline silicon PN junction diode, and the state change element consists of a poly-oxide-poly dielectric rupture antifuse. Other embodiments are set forth in the body of this application.

In this embodiment, a pillar contains four layers of material in a layer stack, deposited sequentially as shown in FIG. 24(*a*): (1) a layer of P+ doped polysilicon 40; (2) a layer of N-doped polysilicon 41; (3) a layer of silicon dioxide 42; (4) a layer of N+ doped polysilicon 43. Layers (40) and (41) form a PN junction diode (the steering element), and layers (41-43) form a poly-oxide-poly dielectric rupture antifuse. In this embodiment the stack of four materials which together create the memory cells are referred to as the "layer stack" 45. There are also a conductor layer below and above the layer stack 45 which is patterned as will be described. These are shown as conductors 46 and 48 in FIG. 24(*a*).

An alternate stack is shown in FIG. 24(*a*) as stack 450. Again it includes conductors at the ends of the stack, specifically 460 and 480 which may be fabricated from any conductive material such as a metal or a polysilicon. The steering element in stack 450 comprises a first layer 400 of P+ doped semiconductor such as microcrystalline silicon, and a second layer 410 of N doped semiconductor such as microcrystalline silicon.

The state change element comprises the layer 420. Layer 420 may be an amorphous silicon layer used to form an antifuse. This layer has a nominal high resistance, however, after a large current is passed through it for programming, its resistance will be substantially lower. The layer 430 is shown as an N+ layer to provide good electrical contact to the overlying conductor 480. Layer 430 could be amorphous, microcrystalline or polysilicon but the processing methods need to be low temperature to maintain the amorphous structure in layer 420.

Another stack 405 is also shown in FIG. 24(*a*). It comprises an N-polysilicon layer 400, a silicon dioxide layer 402 and an N+ polysilicon layer 403. Again, the layers 400 or 403 could be microcrystalline or amorphous semiconductor layers. The stack 405 is sandwiched between the conductors 406 and 408. Here the steering element is a Schottky diode formed by the metal of conductor 406 and the layer 400. The state change element is an antifuse formed by layer 402. By way of example, layers 406 and 408 may be titanium silicide or aluminum with a thickness of approximately 1000 A. The layers 400, 402 and 403 may be 500 A, 80 A, and 500 A in thickness, respectively.

The fabrication sequence for the memory cell is schematically illustrated in FIGS. 24(*b*)-12(*g*). After deposition and before patterning, the layer stack 45 (or the stacks 450 and 405) is a continuous sheet that extends across the entire integrated circuit (indeed across the entire wafer) such as shown in FIG. 24(*b*). Conceptually the selfalignment method is a two-etch-step procedure: In the first etch step, this layer stack (a continuous sheet) is patterned into long straight strips running (say) east-to-west, by etching them with the same patterning step that etches the east-to-west conductors on the conductor layer below. After deposition and planarization of an interlevel dielectric, a second conductor and layer stack is deposited. This stack is patterned into long straight strips running north south. Etching used to pattern the north-to-south lines continues until the first layer stack has also been etched through the steering element. This results in pillars formed on the east-to-west running lines. The resulting pillars are perfectly aligned to both the conductor below and the conductor above since both the pillars and the conductors are etched simultaneously. In alternate embodiments the semiconductor layers within the layer stack (45 or 450 or 405) may be deposited as microcrystalline or polycrystalline, and then laser treated to improve crystallinity and enhance the dopant activation.

The cross-section of the pillar will be rectangular with one dimension being equal to the width of the bottom conductors and the other dimension equal to the width of the top conductors. If these conductors have equal width then the cross-section will be square.

The patterning in both east-to-west and north-to-south uses well-known photolithographic steps widely used in the semiconductor industry and may use either wet or dry etching. Also, the silicon used in the cells and when used for the conductors may be doped insitu or after being deposited, for example, by ion implantation.

Of course other patterning technologies may be used rather than etching, for example "liftoff" technology or "Damascene" technology or an additive rather than subtractive patterning technology may be employed instead of etching. But ideally the layer stack should be patterned in two separate steps, once with the mask that defines the conductors below, and again with the mask that defines the conductors above. This holds true regardless of the specific fabrication techniques used to pattern the various layers.

In practice a large number of vertically stacked memory cells are built, and each conductor layer is selfaligned to both the layer stack below, and the layer stack above. Therefore the etching steps which selfalign the conductors to the pillars, must etch away material from three different layers: the layer stack above, the conductor layer, and the layer stack below.

The processing may begin with a wafer that may have received prior processing steps, for example, CMOS transistors may be fabricated in the monocrystalline substrate for the peripheral circuitry. An insulator then is deposited, and preferably, planarized (using chemical-mechanical polishing ("CMP"), resist etchback planarization, or any of a number of other technologies for planarization). The first conductor layer is deposited such as layer 46 of FIG. 24(*b*), and then the first layer stack 45 is deposited. FIG. 24(*b*) shows the wafer at this stage.

Next, the mask which defines the features on the conductors1 layer is applied, and these features are etched into both the pillar layer stack 45 and the conductors 1 layer 46 below. An insulator is deposited on the wafer and planarized, using CMP or other planarizing technology. FIG. 24(*c*) shows the wafer at this stage. Note in particular that the pillar layer stack and bottom layer have, been etched into long continuous strips (46*a* and 45*a*) and (46*b* and 45*b*), not isolated individual pillars. Also note that the edges of the pillar layer stack 45*a* and 45*b* are aligned to the edges of the conductor 46*a* and 46*b* layer, since both were etched at the same time with the same mask. Note the conductors generally comprise coplanar conductors, such as aluminum or other metals, silicides, or doped silicon conductors, for each level.

While not shown in FIG. 24(*c*) or the other figures, the dielectric fills the voids between the strips (and pillars) and thus adds support to the array. Also it should be noted that the planarization must reveal the upper surface of the strips so that the conductor layer that follows contacts the strips. The planarized dielectric also forms the layers through which the vias and vertical conductors of FIG. 13 in U.S. Pat. No. 6,034,882 pass.

Next, the second conductor layer 50 ("conductors2") is deposited, and the second pillar stack 51 ("stack2") is deposited. FIG. 24(*d*) shows the wafer at this stage. Note that the planarization automatically gives a selfaligned contact between a pillar layer stack (such as 45*b*) and the subsequent conductor layer (such as 50) above it.

Now, the conductors2 mask is applied, and its features are etched downward into three distinct strata: pillarstack2 (51), conductors2 layer 50, and pillarstack1 (45*a* and 45*b*). (This etch stops below the steering element within 45*a* and 45*b*, providing a unique circuit path through the memory cell). An insulator is deposited on the wafer and planarized (using CMP or other means). FIG. 24(*e*) shows the wafer at this stage. Note that the conductors2 mask+etch has completed the definition of the individual pillars (45*a* 1, 45*a* 2, 45*b* 1 and 45*b* 2) in the layerstack1. Also note that these pillars in the layerstack1 layer are aligned to both the conductors1 layer (46*a*, 46*b*) and to the conductors2 layer (50*a*, 50*b*), thereby achieving the goal of selfalignment.

Next, the third conductor layer 52 ("conductors3") is deposited, and the third pillar layerstack 53 ("layerstack3") is deposited. FIG. 24(*f*) shows the wafer at this stage.

Now, the conductors3 mask is applied, and its features are etched downwards into layers stack3, conductors3, and stack2. (This etch stops below the steering element of layer stack 2 and is intended to leave the conductor2 layer intact.) An insulator is deposited on the wafer and planarized (using CMP or other means). FIG. 24(*g*) shows the wafer at this stage. The conductors3 mask+etch has completed the definition of the individual pillars in the layerstack2 layer (such as 51*a* 1, 51*a* 2, 51*b* 2). FIG. 24(*g*) shows that (N+1)=3 conductor layers and hence (N+1)=3 masking steps, are required to pattern (N=2) layers of pillar layerstack (not counting the interlevel via layers which are used in the peripheral circuits but not in the memory array). The wafer is now ready to receive more stack layers and conductor layers, at the discretion of the manufacturer.

In one possible embodiment of an array of the invented memory cells the pillars are vertically stacked directly above one another as illustrated in FIG. 24. Note that pillars are lined up in vertically aligned stacks. However, because of selfalignment, this vertical stacking of pillars directly above one another is not a requirement.

Figure 7:
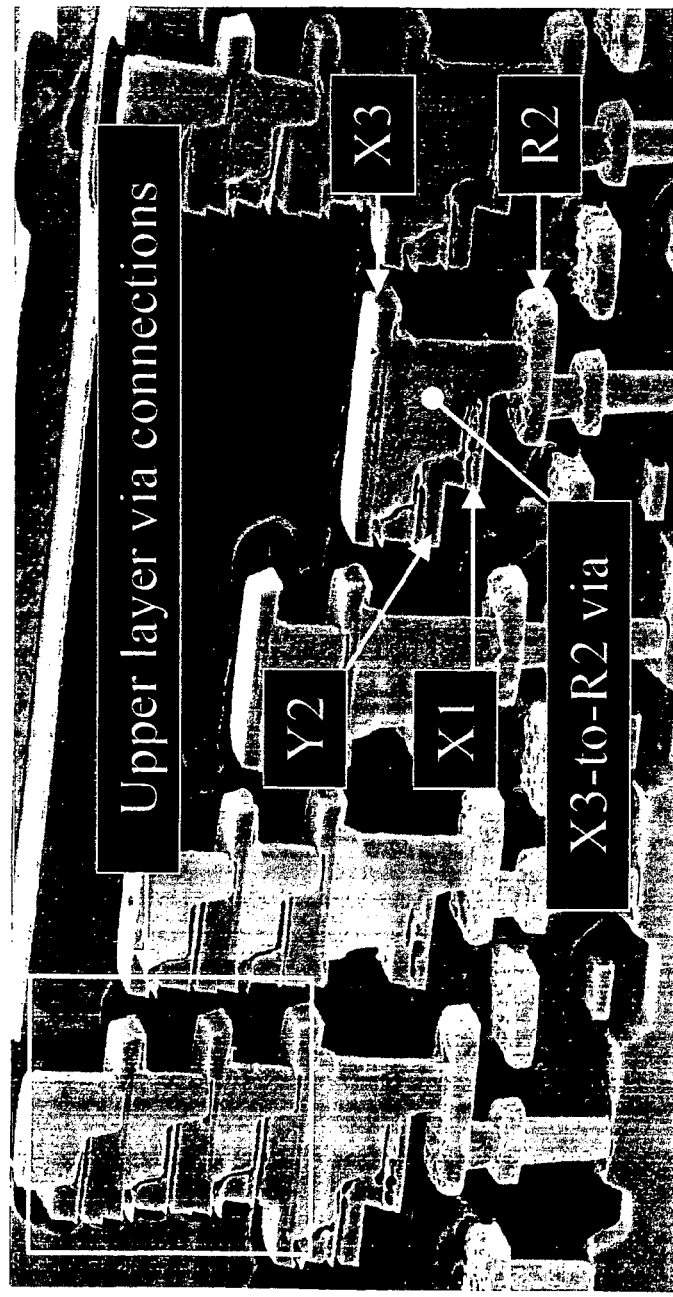
"
FIG. 7 is a drawing labeled "Connections to the Array.
Figure 9:
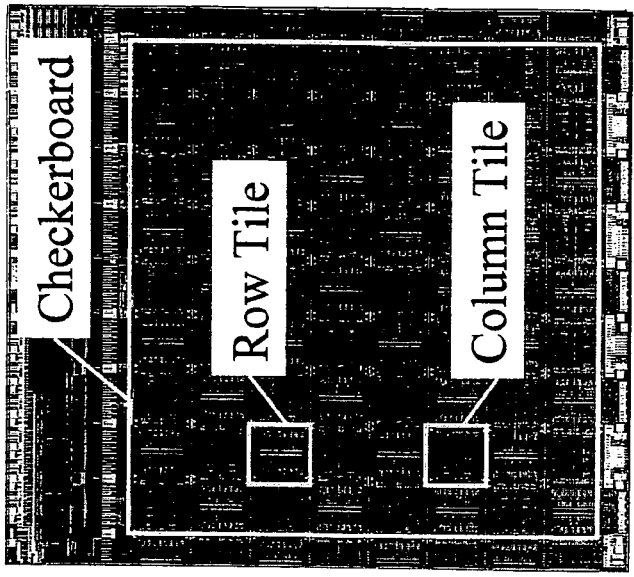
"
FIG. 9 is a drawing labeled "Die Organization (1/3).

Memory cell pillars are automatically formed wherever a conductor on conductor layer (J+1) crosses over a conductor on conductor layer (J). This is true even if the conductor layers are not lined up directly above one another, giving vertical stacks of pillars. In fact it may be preferred that the pillars not be stacked vertically; that is they are offset from one another, as illustrated in FIG. 7 in U.S. Pat. No. 6,034,882. Compare FIG. 5 (vertical stacks of pillars) to FIG. 7 in U.S. Pat. No. 6,034,882 (pillars offset from one another) to see the effect. Offset or staggered pillar placement such as shown in FIG. 7 in U.S. Pat. No. 6,034,882, may be advantageous in practice. It may help give a smoother wafer surface, more suited to planarization and polishing.

In the foregoing sequence of steps, electrode or conductor material is etched along with device material. Since most plasma metal etches also etch polysilicon, a practical combination of materials that enables such dual etching would be aluminum and polysilicon, for example. Control of the etching process may be effected, if desired, through the use of etch chemistries that are selective (e.g., preferentially etching polysilicon, but stopping on aluminum), or through the use of barrier materials that are not etched by the etchants that remove electrode and device material. The state change element may also be used as an etch stop, particularly if it is an oxide rupture type.

Refractory metals such as molybdenum and tungsten are compatible with conventional CVD deposition temperatures for Si and may be used for the conductors. Metal suicides are compatible with even higher temperatures used to activate dopants in Si. Even heavily doped Si itself can be used as a conductor. The choice may be dictated based on resistivity and integration concerns including etch characteristics.

The planarization described after the first half-step of the foregoing is necessary to form self-aligned contacts to the half-etched cells (i.e., the lines running in the east-west direction in the foregoing example). Such planarization may be effected through a variety of means well known in the art, such as chemical-mechanical polishing (CMP), etched-back spin-on dielectric layers, and etched-back spin-on polymers, to cite three well-known examples. To tolerate the possibility of excessive over-polishing or over-etching that may occur during planarization, a second planarization may be performed after deposition of an electrode layer to insure a planar electrode surface for subsequent deposition of device material layers.

The foregoing process sequence exploits self-alignment to reduce the required alignment tolerances between the pillar and the conductors. This embodiment may be substituted with an embodiment involving one or more additional photomasking steps to explicitly define the pillar itself, rather than defining it using the intersection of two conductor photomasking steps, as is done in the self-aligned process. This may be advantageous in various processes that could exploit the explicitly defined sidewalls that would result from such a process. For example, solid-phase crystallization of amorphous silicon could be used to form the steering element layer stack. The free energies of the sidewalls would be expected to favor the formation of a single crystal or grain within the steering element, which may be advantageous in some system embodiments.

Another process that could exploit explicitly defined sidewalls is laser-induced crystallization. Again, the free energies of the sidewalls would be expected to favor the formation of a single crystal or grain within the steering element.

In processes involving the explicit definition of the pillar, a photomasking step would be used to define a bottom conductor. This would be etched. Then, the layer stack required to form the state change and steering elements would be deposited. Another photomasking step would be used to define the pillar, which would be etched. After this etch, an insulating material would be deposited and planarized as in the self-aligned cell, exposing the top of the pillar to form a self-aligned contact. The top conductor would then be deposited and the process would be repeated for subsequent levels of cells as required.

The order of masking steps in the above process could also be reversed. For example, the pillar could be formed prior to patterning the bottom conductor. In this process, the entire layer stack for the bottom conductor, the steering element, and the state change element would be deposited. The pillar would then be lithographically defined and etched down through the steering element. The bottom conductor would then be defined and etched. This structure would be passivated using a planarized insulator contacting scheme, as described above. In all three processes, the self-aligned contact could also be replaced by an explicit contact forming photomasking step.

The various device fabrication steps may result in the presence of residual chemicals or dangling bonds that may degrade device characteristics. In particular, device leakage can result from the presence of such dangling bonds or chemicals (e.g., incompletely removed photoresist). A low-temperature (e.g., <400 C.) plasma oxidation exposure may be used to grow a clean-up oxide on the edges of the device pillar, thereby passivating edge traps. The growth of the oxide is self-limiting because the oxygen species diffuse only slowly through previously grown oxide, resulting in extremely uniform oxide thickness and, therefore, improved manufacturability. (Plasma oxidation may also be used to form an anti-fuse layer.) Oxide deposition may also be used to passivate the surface, for example, either alone or in conjunction with a grown oxide.

Because, in the foregoing for some embodiments, device material (e.g., polysilicon) is deposited after electrode material (e.g., metals), it is desirable to deposit and process the device material at the lowest practical temperatures to widen the selection of suitable metals. As an example, insitu doped polysilicon may be deposited at low temperatures using LPCVD (low pressure chemical vapor deposition), PECVD (plasma-enhanced chemical vapor deposition), PVD (physical vapor deposition), or UHVCVD (ultra high vacuum chemical vapor deposition). An alternative is to deposit undoped polysilicon, followed by doping and activation using a low temperature process. (Traditional activation steps such as long thermal anneals expose the wafer to potentially unacceptably high temperatures.) It may also be desirable in some cases to substitute microcrystalline or amorphous silicon or crystallized amorphous silicon for the polysilicon to enable low temperature fabrication.

Another concern is the possibility of diffusion of electrode material (e.g., metal) into the device layer during processing. Low temperature processing helps to reduce the severity of this problem, but may be insufficient to solve it completely. To prevent this problem, a number of barrier materials may be employed. Examples include titanium nitride (TiN), tantalum (Ta) or tantalum nitride (TaN), among many that are well known to the art.

In one embodiment of the cell, a thin dielectric layer is employed as an antifuse element. In such a cell, good uniformity of dielectric thickness, as well as a low film defect density (e.g., of pinholes in the dielectric) are among highly desirable properties. The quality of the dielectric may be enhanced through a variety of means, such as rotating (continuously or periodically) the substrate and/or source during deposition; forming the dielectric by thermal means using plasmas or low-temperature growth chemistries; or by employing liquid-phase dielectric deposition means.

It is desirable to reduce the number of masking steps that involve critical alignment tolerances. One method for reducing the number of masking steps is to employ vias that interconnect several electrode layers. The vias may be rectangular, rather than square, to allow a relaxation in alignment tolerances. For example, to interconnect metal lines in several layers running in the x-direction, the x-edge via size may be made substantially looser than the pitch of the x-lines in the y-direction, resulting in a rectangular via. Vias are discussed in conjunction with FIGS. 12 and 13 in U.S. Pat. No. 6,034,882.

Rail-Stack Three-Dimensional Memory Devices

Overview of the Structure of the Invented Memory Array

The invented memory array is fabricated on several levels and, for instance, may have eight levels of storage. Each level includes a first plurality of parallel spaced-apart rail-stacks running in a first direction and a second plurality of rail-stacks or conductors (depending on the embodiment) running in a second direction. Generally, the first rail-stacks run perpendicular to the second conductors/rail-stacks and hence form a right angle at their intersections. (In the invented array as well as in the prior art, conductors at one level are shared with the next level, hence the term "level" may not be precisely descriptive.)

The use of rail-stacks is a departure from prior art three-dimensional memories where conductors alone were used in lieu of rail-stacks, and where discrete cells (e.g., pillars) were formed at the intersections of the lines. As will be seen, a bit is stored at each of the intersections of rail-stacks. However, there is no apparent individual memory cell at the intersections, rather memory cells are defined by the rail-stacks and intermediate layers. This makes it easier to fabricate the invented array as will be seen. When the array is fabricated all the bits are in the zero (or one) state and after programming, the programmed bits are in the one (or zero) state.

Figure 25:
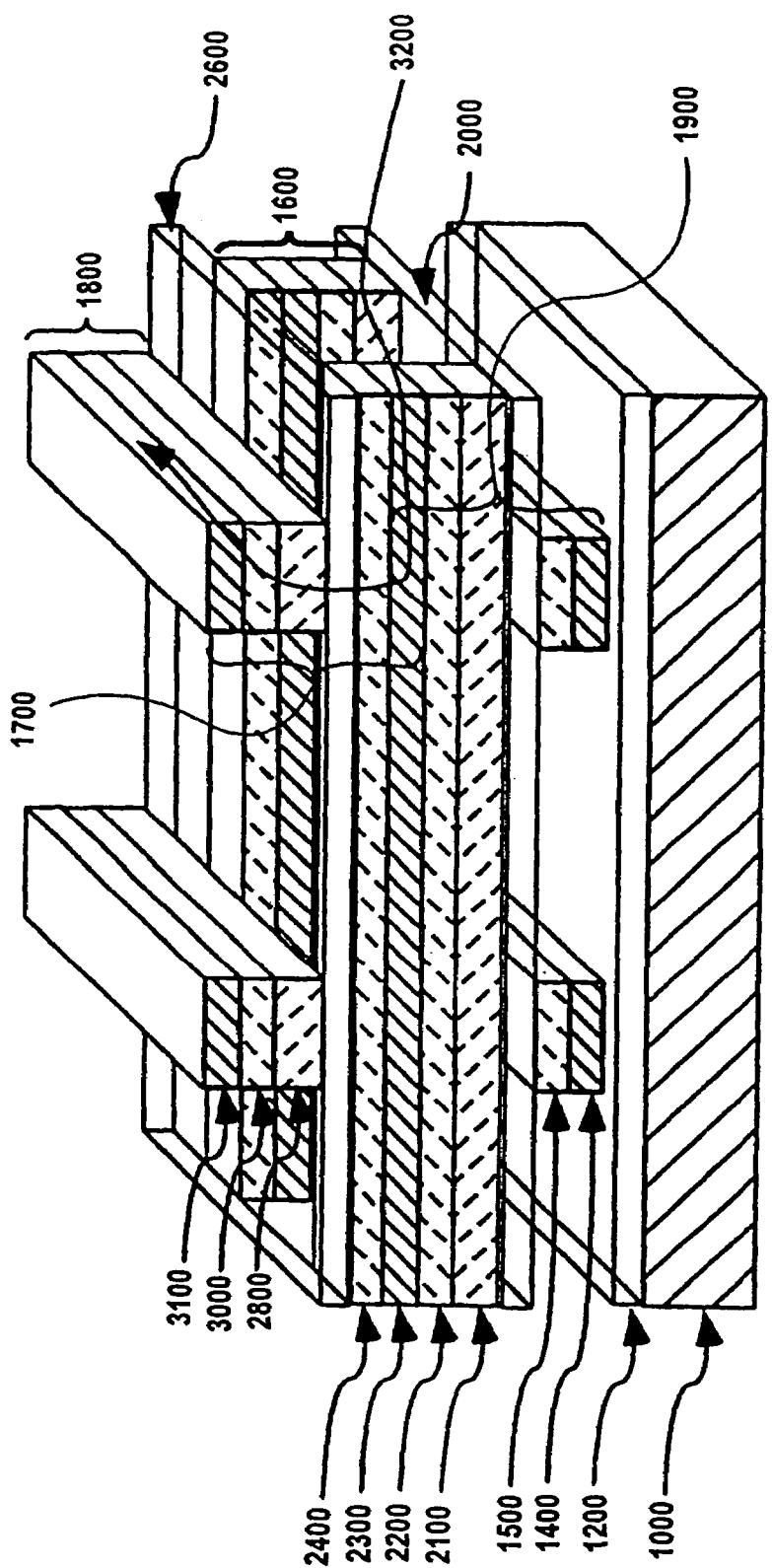
FIG. 25 is a perspective view of a cut-away portion of the invented array.

In the embodiment FIG. 25 several rail-stacks are illustrated in the partial cross-section of the invented array. For instance, rail-stack 1600 is shown at one height and a half rail-stack 1800 is shown at a second height above the first height. Also, half rail-stacks are disposed between rail-stack 1600 and a substrate 1000. These lower rail-stacks run in the same direction as the half rail-stack 1800. A bit is stored at the intersection of rail-stacks and, for instance, a "cell" is present between the rail-stacks and layers shown within the bracket 1700 and another within the bracket 1900. Each of these brackets span a memory level.

The array is fabricated on a substrate 1000 which may be an ordinary monocrystalline silicon substrate. Decoding circuitry, sensing circuits, and programming circuits are fabricated in one embodiment within the substrate 1000 under the memory array using, for instance, ordinary MOS fabrication techniques. (These circuits may also be fabricated above the substrate.) Vias are used to connect conductors within the rail-stacks to the substrates to allow access to each rail-stack in order to program data into the array and to read data from the array. For instance, the circuitry within the substrate 1000 may select rail-stack 1600 and the rail stack 1800 in order to either program or read a bit associated with the intersection of these rail-stacks. (In the case of the embodiments of FIG. 29 some conductors are not part of rail-stacks; these conductors are also coupled to the substrate circuits.)

As shown in FIG. 25, an insulating layer 1200 is formed over the substrate in order that the array may be fabricated above the substrate. This layer may be planarized with, for instance, chemical-mechanical polishing (CMP) to provide a flat surface upon which the array may be fabricated.

Following this, a conductive layer 1400 is formed on the substrate. As will be seen, conductive layers are used within the rail-stacks and these layers and the resultant conductors may be fabricated from elemental metals such as tungsten, tantalum, aluminum, copper or metal alloys may be used such as MoW. Metal suicides may also be used such as TiSi2, CoSi2 or a conductive compound such as TiN, WC may be used. A highly doped semiconductor layer such as silicon is also suitable. Multiple layer structures may be used selecting one or more of the above.

Following the deposition of a conductive layer, a layer of semiconductor material (layer 1500) such as silicon is formed over the conductive layer. This is typically a polysilicon layer, however, an amorphous layer may be used. Other semiconductor materials may be used such as Ge, GaAs, etc. In the embodiment of FIG. 25 this semiconductor layer is highly doped and, as will be seen, forms one-half a diode. After masking and etching steps, half rail-stacks are formed. These rail-stacks are "half" or partial rail-stacks since they are approximately half the thickness of the rail-stacks used in the next level.

Following this, in the embodiment of FIG. 25, a material for the antifuses used to program the array is deposited. In one embodiment, the layer 2000 is a dielectric such as silicon dioxide which is deposited by chemical vapor deposition (CVD) in a blanket deposition over the half rail-stacks and a dielectric fill, filling the space between the rail-stacks. In another embodiment the layer 2000 is grown on the upper surface of the silicon layer 1500 and only exists on the rail-stacks.

Now a full set of memory array rail-stacks is formed on the layer 2000. This comprises first the deposition of a lightly doped silicon layer 2100 doped with a conductivity type dopant opposite to that used for the silicon layer 1500, a heavily doped silicon layer 2200 doped also opposite to the layer 1500, a conductive layer 2300 and a heavily doped silicon layer 2400 doped with the same conductivity type dopant as layers 2100 and 2200. After masking and etching, the rail-stacks shown in FIG. 25, such as rail-stack 1600 are formed. These rail-stacks are, as illustrated, in a direction perpendicular to the rail-stacks above and below them.

While not shown in FIG. 25 but as will be described later, the spaces between the rail-stacks after they are defined, are filled with a dielectric such as silicon dioxide. Then the rail-stacks and fill are planarized by CMP. In another embodiment spin-on-glass (SOG) is used to fill the voids, in this case chemical planarization can be used, for example, plasma etching. Other fill and planarization methods can be used.

After formation of the rail-stacks another antifuse layer 2600 is formed, for instance, from a dielectric such as silicon dioxide, silicon nitride, silicon oxynitride, amorphous carbon or other insulating materials or combinations of materials. (Also an updoped layer of silicon may be used for the antifuse layer.)

Now another layer of rail-stacks are defined and only half rail-stacks are shown in FIG. 25 at this upper level. This half rail-stack comprises a silicon layer 2800 doped with a conductivity type dopant opposite to that of layer 2400. This is a lightly doped layer. Another silicon layer 3000 is formed on layer 2800 and this layer is doped with the same conductivity type dopant as layer 2800, however, it is more heavily doped. Then a conductive layer 3100 is formed above the layer 3000.

Half rail-stacks are used at the very upper-most level of the array and at the very lowest level of the array. In between the half rail-stacks the full rail-stacks, such as rail-stack 1600, are used throughout the array.

It should be noted that the silicon layers disposed on the conductive layers extend the entire length of the rail-stacks in the embodiment of FIG. 25 and are uninterrupted except possibly where vias are used to provide a conductive path to the substrate 1000.

In FIG. 25 a path 3200 is illustrated from a lower conductor in level 1700 to an upper conductor in this level found in the rail-stack 1800. This path is accessed in one embodiment through decoding circuitry in the substrate for both programming and reading of data into and from the array for one bit.

For instance, to program the bit, a relatively high voltage, 5-20V is applied between the conductors generally so as to forward-bias the "diode" between these conductors. This relatively high voltage causes a breach-in the layer 2600 creating a diode. Without this high voltage, the layer 2600 remains an insulator. Thus, by selecting pairs of conductors, diodes can be selectively formed so as to program the array. While programming the array with the layers adjacent to the antifuse material being forward-biased is currently preferred, it is also possible to program using a reverse-biasing potential.

To sense the data programmed into the array, a voltage lower than that for programming is used. This voltage is applied so as to forward-bias the diode of the cell being accessed and thus allowing a sense amplifier to determine whether or not the layer 2600 is intact between the rail-stacks. Note that "sneak" or parasitic paths in the array which would interfere with the sensing will include a reverse-biased diode.

Figure 27:
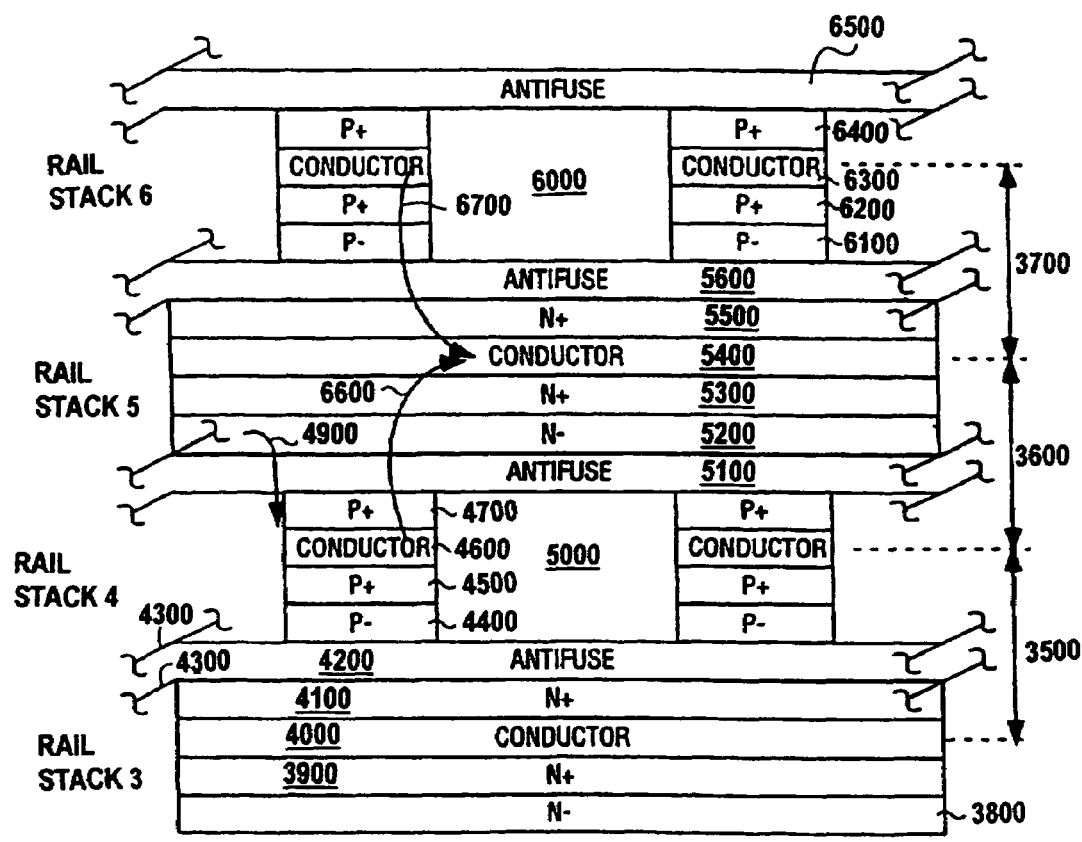
FIG. 27 is a cross-sectional elevation view of one embodiment of the present invented array.

Embodiment of FIG. 27

In the cross-section elevation view of FIG. 27, one embodiment is illustrated which corresponds to the embodiment shown in FIG. 25. In FIG. 27 the half rail-stacks of FIG. 25 are not illustrated. Three complete levels 3500, 3600 and 3700 of the array are illustrated in FIG. 27. Below layer 3800 of FIG. 27 other rail-stacks or half rail-stack are used. Also above layer 6500, a full or half rail-stack is used.

The rail-stack 3 comprising layers 3800 through 4100 includes a lightly doped n– layer 3800, a heavily doped n+ layer 3900, a conductor layer 4000 and n+ layer 4100. The fabrication of these rail-stacks will be discussed in more detail in conjunction with FIG. 26A through FIG. 26G. An antifuse layer 4200 which for the embodiment of FIG. 27 is a blanket deposition covers all of the rail-stacks formed below layer 4200 as well as the fill filling the voids between the rails. As mentioned, the layer 4200 is a deposited silicon dioxide layer in one embodiment.

It should be noted that n+ layers sandwich the conductor layer 4000. These highly doped layers provide ohmic transitions to prevent unintended Schotky formation.

The layers above and below conductor 4000 are not symmetrical for the embodiment illustrated in that an n– layer 3800 is used below the conductor 4000 and not above the conductor 4000. Only a single lightly doped layer (in conjunction with a heavily doped layer) is needed to define a diode; the thickness of this lightly doped layer is important in controlling the break-down voltage and resistance of the diode so formed. The layer 4100, a heavily doped semiconductor layer, and the fill are planarized after the rail-stacks are defined and then a blanket deposition of the antifuse layer 4200 is formed on the layer 4100. (The lines 4300 in FIG. 27 are used to indicate that the antifuse layer 4200 and like layers are not etched with the rail-stack below it and thus extend over the entire array for the illustrated embodiment.)

One advantage to the layer 4200 and the other like layers in the structure, such as layers 5100, 5600 and 6500, is that since they are an unbroken deposition, sidewall leakage (into the rail-stacks below) will be minimized, limiting electrical problems during reading and writing. When subsequent conductive material is deposited, it is unable to reach the sides of the rail-stacks below it because of this blanket deposition of the antifuse layer. For instance, path 4900 which would allow silicon from layer 5200 to cause a parasitic path does not exist because of the unbroken blanket deposition of the antifuse layer 5100.

Rail-stacks 4 comprising layers 4400, 4500, 4600 and 4700 are formed on the antifuse layer 4200. Layer 4400 is lightly doped with a p-type dopant for the embodiment illustrated followed by a p+ layer 4500, a conductive layer 4600 and a p+ layer 4700. After these layers are deposited, they are masked and etched to define the rail-stacks. Then the voids between these rail-stacks, such as void 5000, are filled with a dielectric. The fill dielectric is planarized along with a portion of p+ layer 4700. Planarization is done at this point in the fabrication since there is generally poor control over the thickness and contour of the fill. The fill tends to build up on the rail-stacks when a non-spin-on deposition is used. This is followed by a blanket deposition of layer 5400.

The process is now repeated this time beginning with an n– layer 5200 followed by an n+ layer 5300, a conductive layer 5400 and n+ layer 5500. Again after defining the rail-stacks 5, the voids are filled and the surface is planarized. Another antifuse layer 5600 is deposited. The process is repeated for the rail-stacks 6 this time beginning with a p– layer 6100, p+ layer 6200, conductive layer 6300, p+ layer 6400. Again after defining the rail-stacks, filling the void 6000 and then planarizing, another antifuse layer 6500 is deposited.

As shown by the path 6600, when a large enough voltage is applied between conductors 4600 and 5400 the antifuse layer 5100, at the intersection of layers 4700 and 5200 is breached creating a diode at the intersection. As mentioned, this is selectively done throughout the array to program the array. The conductor 5400 is therefore a bit line for the "cells" above and below it, for instance path 6700 indicates another possible current path for another "cell" where the conductor 5400 is again a bit line during sensing.

It should be noted that with the reversal of the p– and n– layers at each successive rail-stack, planarization always occurs on a heavily doped layer such as layer 4700 and layer 5500. Moreover, the lightly doped layers are always formed on relatively planar surfaces, consequently their thickness can be more easily controlled. This, as mentioned, allows the characteristics of the diode (once the intermediate antifuse layer is breached) to be more reliably controlled.

Processing Flow for the Embodiment of FIG. 27

The process flow for forming rail-stack 5 of FIG. 27 is illustrated in FIGS. 26A-26H. It will be apparent that the rail-stacks for the other embodiment (FIGS. 28 and 29) are similarly processed.

First, as shown in FIG. 26A an antifuse layer 5100 is deposited. This typically is 50-200 Å of silicon dioxide which can be deposited with any one of very well-known processes. Following this, a silicon layer 5200 is deposited which is typically 1000-4000 Å thick and formed with a CVD process where a phosphorous dopant is deposited along with the deposition of for instance, the polysilicon semiconductor material or where the dopant is ion implanted following the deposition of the layer. This layer is doped to a level of $5 \times 10^{16} - 10^{18}/cm^3$.

Now, as shown in FIG. 26B an n+ layer 5300 is deposited again using CVD. This layer may be approximately 300-3000 Å thick and in one embodiment is doped to a level of $>10^{19}/cm^3$.

Throughout this application two adjacent silicon layers are often shown such as layers 5200 and 5300, with different doping. These layers may be formed with one deposition and then using ion implantation step at two different energy levels to obtain the two doping levels.

A conductive layer which may be 500-1500 Å thick is formed using any one of numerous well-known thin film deposition process such as sputtering. A refractory metal may be used or a silicide of a refractory metal. Also as mentioned aluminum or copper can be used, or more simply the heavily doped silicon can be the conductor.

Next another semiconductor layer of, for instance, polysilicon approximately 1500-2000 Å thick is formed again doped to a level of $>10^{19}/cm^3$. This is shown as layer 5500 in FIG. 26D; after planarization its thickness is between 300 Å and 2000 Å thick.

A masking and etching step is now used to define rail-stacks, such as rail-stacks 6900, 7000 and 7100 shown in FIG. 26E. Note that when comparing this view to the view of rail-stack 5 of FIG. 27, the view in FIG. 26E is taken from the side and consequently shows the individual rail-stacks. An ordinary masking and etching step for instance using plasma etching, may be used. Etchants can be used that stop on the antifuse layer thus preventing this layer from being etched away. Thus, layer 5100 can be considered an etchant stop layer depending on the specific etchants used.

Figure 26F:
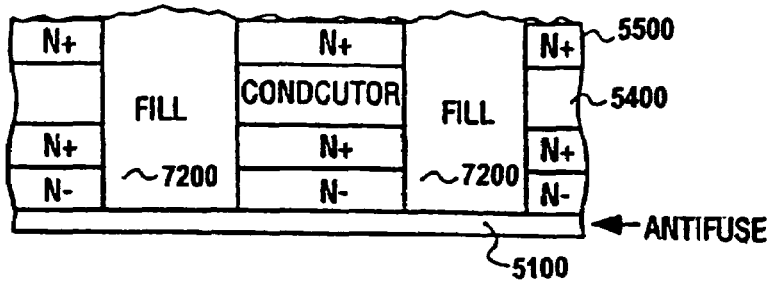
Figure 26G:
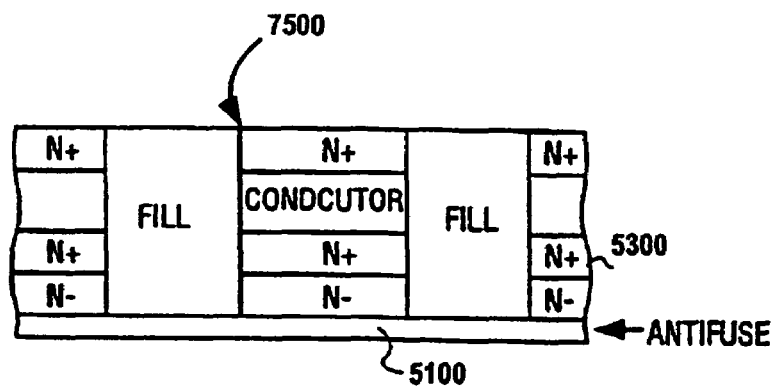

Now as shown in FIG. 26F, the spaces between the rail-stacks are filled with a dielectric such as formed with a HDPCVD process.

Chemical-mechanical polishing is then employed to planarize the upper surface of the rail-stacks shown in FIG. 26F in one embodiment. Chemical etching can also be used as mentioned with certain dielectrics. This planarization can reduce the thickness of the layer 5500 to approximately 500 Å, thus this layer ends up being of approximately the same thickness as the layer 5300.

Figure 26H:
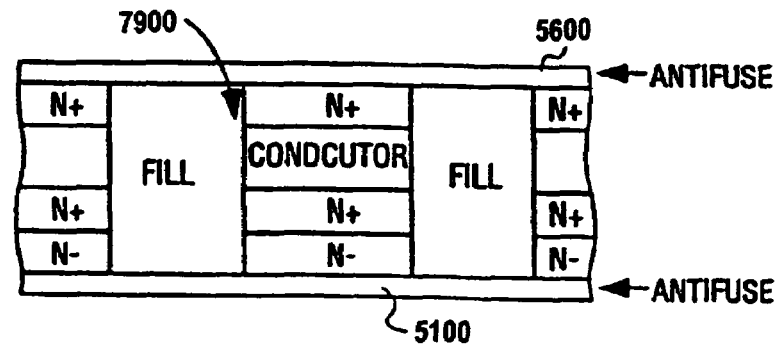

Next as shown in FIG. 26H another antifuse layer 5600 is formed on the planarized surface 7500. Since the layer 5600 is deposited over all the rail-stacks and the filler material and remains unetched, it forms a barrier to the migration of the materials subsequently deposited that might make their way along the sides of the rail-stacks such as along path 7900. Thus the layer 5600 helps prevent the parasitic paths and potential shorts that may occur with prior art memories.

It should be noted that in FIG. 27 while the antifuse layer is shown as a blanket layer covering the rail-stacks and fill, it is possible also to fabricate each level where the antifuse layer is in fact grown from a semiconductor layer. For instance, an oxidation step may be used to grow a silicon dioxide layer from layers 4100, 4700, 5500 and 6400. This grown layer would then be in lieu of the antifuse layers shown in FIG. 27.

Figure 28:
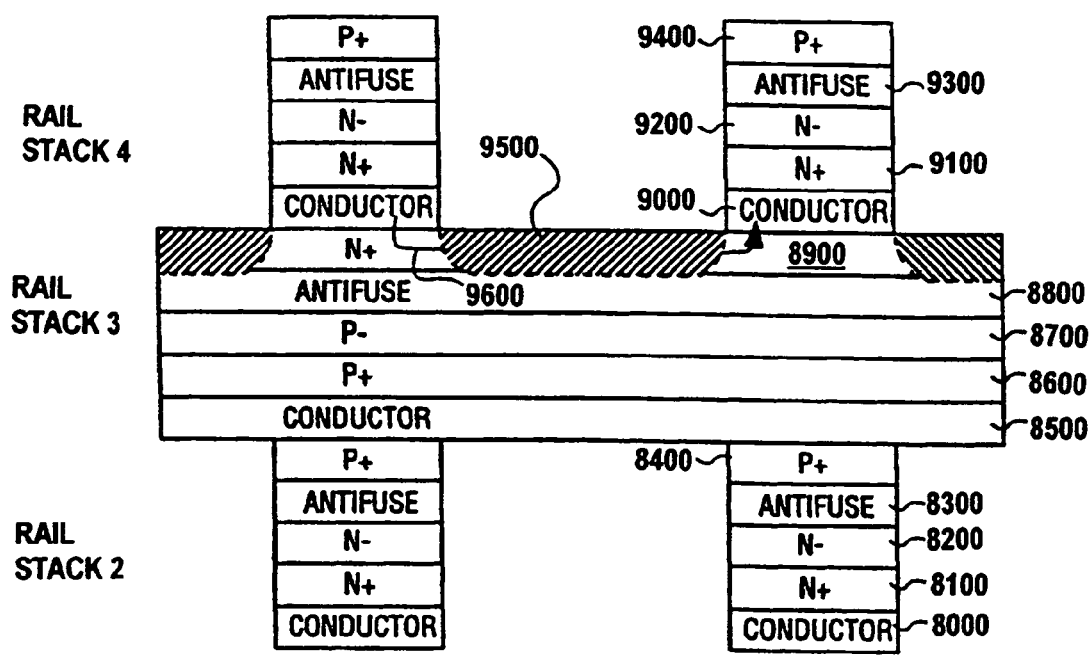
FIG. 28 is a cross-sectional elevation view of a second embodiment of the invented array.

The Embodiment of FIG. 28

For the embodiment of FIG. 28 each rail-stack begins with a conductor such as layer 8000 of FIG. 28. An n+ semiconductor layer 8100 and an n− layer 8200 are formed on layer 8000. Next a layer of antifuse material 8300 is formed. Then a p+ layer 8400 of semiconductor material is deposited (e.g., silicon with boron dopant) on the antifuse. When the rail-stacks are formed, for instance for rail-stack 200 of FIG. 28, the antifuse layer 8300 is etched as well as layers 8000, 8100, 8200 and 8400.

The voids between the rail stacks are now filled and planarization is done, planarizing the fill with the upper surface of the layer 8400. Following the completion of the rail-stack 2 the next rail-stacks are formed shown as rail-stacks 3 in FIG. 28. This comprises a conductor layer 8500, p+ layer 8600, p− layer 8700, antifuse layer 8800 and n+ layer 8900. Again masking and etching occur. This etching also etches the exposed regions of layer 8400 which does not appear in the view of FIG. 28, but this will be apparent shortly when region 9500 of the next stack is discussed. Now filling and planarization occurs and the next layer of rail-stacks are formed shown as rail-stack 400. As illustrated, this comprises a conductive layer 9000, n+ layer 9100, n− layer 9200, antifuse layer 9300, and p+ layer 9400. Once again masking, etching, filling and planarization occur.

Unlike the embodiment of FIG. 27, when rail-stacks at any particular height are formed, etching must occur on one layer of the rail-stack immediately below the rail-stack being defined. For instance, when rail-stack 4 is etched the layer 8900 of rail-stack 3 is etched away where it is not covered by rail-stack 4 as shown by region 9500. This etching is used to remove all of the semiconductor material between the adjacent conductors and consequently prevent a path, such as path 9600 shown in FIG. 28. This etching also occurs to layer 8400 which, as mentioned, is not seen in FIG. 28. In this connection the antifuse layer 8800 can be used as an etchant stop, although this is not necessary. No harm is done if etching does occur through the layer 8800 since the antifuse layer is only needed at the intersections of the rail-stacks. Note the etching of the region 9500 is done in alignment with overlying rail-stacks and consequently no additional masking is required.

As was the case with the earlier embodiment, the order of the n and p doped layers alternate with each successive rail-stack. Moreover, the rail-stacks at any given height include both p and n layers. In contrast, for the embodiment of FIG. 27, at any particular height, the rail-stacks are doped with either an n type or p type dopant but not both.

Figure 29:
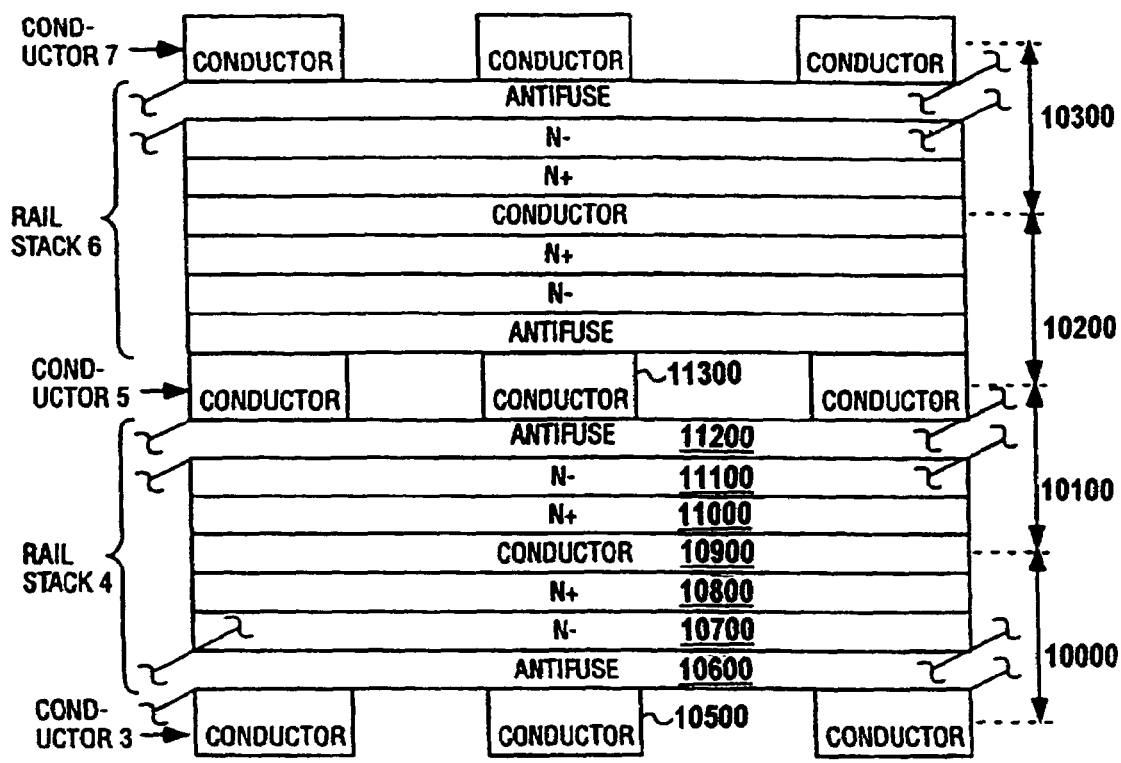
FIG. 29 is a cross-sectional elevation view of a third embodiment of the invented array.

Embodiment of FIG. 29

In the embodiment of FIG. 29, alternate levels of rail-stacks running in a first direction and intermediate layers of conductors are running in a second direction are used. For instance as shown in FIG. 29, the conductors 3, 5 and 7 run in a first direction whereas the rail-stacks 4 and 6 run in a second direction.

In this embodiment each of the rail-stacks is symmetrical about a conductor such as conductor 10900 of rail-stack 4. The conductor is sandwiched between two n+ layers 10800 and 11000. More lightly doped outer layers 10700 and 11100 are disposed on these more heavily doped layers.

In fabrication the conductors such as conductors 10500, are first formed, for instance, on the substrate. The spaces between these conductors may be filled and planarization may occur. Then an antifuse layer 10600, n− layer 10700, n+ layer 10800, conductive layer 10900, n+ layer 11000 and n− layer 11100 are deposited. Rail-stacks are then defined by masking and etching. The voids between the rail-stacks are then filled with a dielectric. Then planarization of the filling material and the upper surface of layer 11100 is performed. Following this, antifuse layer 11200 is deposited over the entire array. Now additional conductors are formed such as conductors 11300. Each level in this array is between a metallic conductor such as conductor 10500, and a sandwich conductor such as conductor 10900. Thus there are four memory levels shown in FIG. 29, levels 10000, 10100, 10200 and 10300.

Programming in this array causes the formation of Schottky diodes consequently, the conductors such as conductors 10500 and 11300 must be of a suitable material to allow formation of a Schottky diode. For instance, aluminum and some refractory metal or silicides may be used.

Other Embodiments

In the above description a conductor is shared by two levels. An array may be fabricated where there are two conductors for each level that are not shared with other levels. A dielectric may be used to separate each such level. Also while above diodes on alternate levels "point" in the same direction, this is not necessary. For instance, a shared conductor may have diodes point-in from above and point-out from below. This requires different driving circuitry in the substrate.

Any term, concept, feature, drawing, method, apparatus, system, etc. or portion thereof, described in the above-listed documents can be used alone or in combination to support claims of this or any other non-provisional patent application(s) claiming the benefit of U.S. provisional application No. 60/446,910. Additionally, the material described in the above-listed documents provides only some of many possible implementations. For this reason, the above-listed documents are intended by way of illustration and not by way of limitation. It is only the claims, including all equivalents, in this and any other non-provisional patent application(s) that claim the benefit of U.S. provisional application No. 60/446,910 that are intended to define the scope of inventions supported by the above-listed documents. The following claims express the statements made in this paragraph.

What is claimed is:

1. A chip-level architecture comprising:
    a monolithic three-dimensional write-once memory array, wherein the monolithic three-dimensional write-once memory array comprises:
        a first conductor;
        a first memory cell above the first conductor;
        a second conductor above the first memory cell; and
        a second memory cell above the second conductor;
        wherein the second conductor is the only conductor between the first and second memory cells; and
    at least two of the following system blocks:
        an Error Checking & Correction Circuit (ECC);
        a Checkerboard Memory Array containing sub arrays;
        a Write Controller;
        a Charge Pump;
        a Vread Generator;
        an Oscillator;
        a Band Gap Reference Generator; and
        a Page Register/Fault Memory.

2. The invention of claim 1, further comprising a third system block.

3. The invention of claim 1, wherein one of the system blocks is the Vread Generator.

4. The invention of claim 3, wherein the Vread Generator provides a voltage to which a selected word line is driven during a read operation.

5. The invention of claim 4, wherein two control transistors per group of memory sub arrays are spatially distributed throughout the die to achieve reduced voltage drop along reference node Vread.

6. The invention of claim 1, wherein one of the system blocks is the write controller, and wherein groups of selected sub arrays are connected together by bidirectional data lines and are connected to the write controller.

7. The invention of claim 6, wherein selected cells are in selected sub arrays, each of which has a coordinated row decoder for locating the selected cells.

8. The invention of claim 6, wherein the connection between the groups of sub arrays and the write controller includes data lines and control lines, said lines which are at least partially formed on a level of wiring at or near a top surface of the memory array.

9. The invention of claim 8 wherein the data and control lines are substantially parallel to memory array lines used for sensing data in memory cells.

10. The invention of claim 6, wherein the selected sub arrays contain user data cells, ECC data cells and cells containing redundancy control bits.

11. The invention of claim 1, wherein one of the system blocks is the write controller, and further comprising a fault memory and a logic block, wherein entries in the fault memory are determined by the write controller during the write operation and read by the logic block to activate a write operation to a redundant row.

12. The invention of claim 1, wherein the first memory cell, second memory cell, and second conductor are all in a plane defined by the second conductor, and wherein the second conductor is the only conductor between the first and second memory cells in the plane.

13. A chip-level architecture comprising:
    a monolithic three-dimensional write-once memory array, wherein the monolithic three-dimensional write-once memory array comprises:
        a first conductor;
        a first memory cell above the first conductor;
        a second conductor above the first memory cell; and
        a second memory cell above the second conductor;
        wherein the second conductor is the only conductor between the first and second memory cells;
    ECC; and
    smart write.

14. The invention of claim 13, wherein the first memory cell, second memory cell, and second conductor are all in a plane defined by the second conductor, and wherein the second conductor is the only conductor between the first and second memory cells in the plane.

* * * * *